US011210866B2

(12) United States Patent
Mehr et al.

(10) Patent No.: US 11,210,866 B2
(45) Date of Patent: Dec. 28, 2021

(54) FORMING A DATASET FOR INFERENCE OF EDITABLE FEATURE TREES

(71) Applicant: DASSAULT SYSTEMES, Velizy Villacoublay (FR)

(72) Inventors: Eloi Mehr, Velizy Villacoublay (FR); Fernando Manuel Sanchez Bermudez, Velizy Villacoublay (FR)

(73) Assignee: DASSAULT SYSTEMES, Velizy Villacoublay (FR)

( * ) Notice: Subject to any disclaimer, the term of this patent is extended or adjusted under 35 U.S.C. 154(b) by 14 days.

(21) Appl. No.: 16/727,207

(22) Filed: Dec. 26, 2019

(65) Prior Publication Data

US 2020/0250894 A1   Aug. 6, 2020

(30) Foreign Application Priority Data

Dec. 29, 2018   (EP) ..................... 18306885

(51) Int. Cl.
| | |
|---|---|
| *G06T 19/20* | (2011.01) |
| *G06F 16/901* | (2019.01) |
| *G06F 30/12* | (2020.01) |
| *G06N 3/08* | (2006.01) |
| *G06T 17/10* | (2006.01) |
| *G06N 3/04* | (2006.01) |

(Continued)

(52) U.S. Cl.
CPC .......... *G06T 19/20* (2013.01); *G06F 16/9027* (2019.01); *G06F 30/12* (2020.01); *G06N 3/08* (2013.01); *G06T 2219/2021* (2013.01)

(58) Field of Classification Search
CPC ... G06F 16/9027; G06F 30/12; G06N 3/0445; G06N 3/0454; G06N 3/08; G06N 3/084; G06N 3/088; G06N 5/003; G06T 17/005; G06T 17/10; G06T 19/20; G06T 2219/2021

See application file for complete search history.

(56) References Cited

U.S. PATENT DOCUMENTS

| | | | |
|---|---|---|---|
| 2008/0215510 A1* | 9/2008 | Regli ...................... G06T 19/00 706/12 |
| 2018/0365565 A1* | 12/2018 | Panciatici ............ G06K 9/6255 |

OTHER PUBLICATIONS

Extended European Search Report dated Jul. 11, 2019 in Europe Patent Application No. 18306884.0-1221; (8 pages). (References AU and AV are cited therein).

(Continued)

*Primary Examiner* — Sing-Wai Wu
(74) *Attorney, Agent, or Firm* — Oblon, McClelland, Maier & Neustadt, L.L.P.

(57) ABSTRACT

The disclosure notably relates to a computer-implemented method for forming a dataset configured for learning a neural network. The neural network is configured for inference, from a discrete geometrical representation of a 3D shape, of an editable feature tree representing the 3D shape. The editable feature tree comprises a tree arrangement of geometrical operations applied to leaf geometrical shapes. The method includes obtaining respective data pieces, and inserting a part of the data pieces in the dataset each as a respective training sample. The respective 3D shape of each of one or more first data pieces inserted in the dataset is identical to the respective 3D shape of respective one or more second data pieces not inserted in the dataset. The method forms an improved solution for digitization.

14 Claims, 6 Drawing Sheets

(51) Int. Cl.
G06N 5/00 (2006.01)
G06T 17/00 (2006.01)
G06F 9/451 (2018.01)

(56) References Cited

OTHER PUBLICATIONS

Gopal Sharma, et al.; "CSGNet: Neurall Shape Parser for Constructive Solid Geometry"; 2018 IEEE/CVF Conference on Computer Vision and Pattern Recognition, IEEE, Jun. 18, 2018, pp. 5515-5523, XP033473465; DOI: 10.1109/CVPR.2018.00578. (9 pages).
Tao Du, et al., "InverseCSG: Automatic Conversion of 3D Models to CSG Trees," Dec. 4, 2018; Dec. 4, 2018-Dec. 7, 2018; Dec. 4, 2018; ISBN; 978-1-503-6008-1; XP058422600; DOI: 10.1145/3272127.3275006. (16 pages).
Extended European Search Report dated Jun. 26, 2019 in Europe Patent Application No. 18306885.7-1230; (9 pages). (References AV, AX, and AY are cited therein).
Gopal Sharma, et al.; "CSGNet: Neural Shape Parser for Constructive Solid Geometry": arXiv:1712.08290v2; XP055595977; University of Massachusetts; Amherst, USA; Mar. 31, 2018; Retrieved From the Internet: URL: https://arxiv.org.pdf/1712.08290.pdf [retrieved Jun. 12, 2019]; (16 pages).
Quanqing Li, "Research on CAD Feature Modeling Technology of Reverse Engineering", Education Technology and Computer Science (ETCS), 2010 Second International Workshop on Education Technology and Computer Science, IEEE, Piscataway, NJ, USA, Mar. 6, 2010, pp. 337-40, XP031673620, ISBN: 978-1-4244-6388-6.

* cited by examiner

FORMING A DATASET FOR INFERENCE OF EDITABLE FEATURE TREES

CROSS-REFERENCE TO RELATED APPLICATIONS

This application claims priority under 35 U.S.C. § 119 or 365 to European Application No. 18306885.7, filed Dec. 29, 2018. The entire contents of the above application(s) are incorporated herein by reference.

FIELD OF THE DISCLOSURE

The disclosure relates to the field of computer programs and systems, and more specifically to solutions related to learning a neural network configured for inference, from a discrete geometrical representation of a 3D shape, of an editable feature tree representing the 3D shape.

BACKGROUND

A number of systems and programs are offered on the market for the design, the engineering and the manufacturing of objects. CAD is an acronym for Computer-Aided Design, e.g. it relates to software solutions for designing an object. CAE is an acronym for Computer-Aided Engineering, e.g. it relates to software solutions for simulating the physical behavior of a future product. CAM is an acronym for Computer-Aided Manufacturing, e.g. it relates to software solutions for defining manufacturing processes and operations. In such computer-aided design systems, the graphical user interface plays an important role as regards the efficiency of the technique. These techniques may be embedded within Product Lifecycle Management (PLM) systems. PLM refers to a business strategy that helps companies to share product data, apply common processes, and leverage corporate knowledge for the development of products from conception to the end of their life, across the concept of extended enterprise. The PLM solutions provided by Dassault Systernes (under the trademarks CATIA, ENOVIA and DELMIA) provide an Engineering Hub, which organizes product engineering knowledge, a Manufacturing Hub, which manages manufacturing engineering knowledge, and an Enterprise Hub which enables enterprise integrations and connections into both the Engineering and Manufacturing Hubs. Ali together the system delivers an open object model linking products, processes, resources to enable dynamic, knowledge-based product creation and decision support that drives optimized product definition, manufacturing preparation, production and service.

In this context, researchers have been looking for solutions to infer a plausible editable feature tree representing a 3D shape from a discrete representation of the 3D shape. In particular, finding a plausible CSG tree corresponding to a raw input mesh has been drawing attention. This problematic falls within the more generic topic called "digitization".

The following references notably relate to digitization:
[1] Bénière & al: Topology Reconstruction for B-Rep Modeling from 3D Mesh in Reverse Engineering Applications, 2012.
[2] Flavien Boussuge & al: Extraction of generative processes from B-Rep shapes and application to idealization transformations, 2014.
[3] S. Gauthier & al: Digitized 3d mesh segmentation based on curvature analysis, 2017.
[4] D. Cohen-Steiner & al: Restricted Delaunay Triangulation and Normal Cycle, 2003.
[5] B. Levy & al: Lp Centroidal Voronoi Tesselation and its application, 2010.
[6] F. Boussuge: Idealization of CAD assemblies for FE structural analyses, chapter 4: Extraction of generative processes from B-Rep shapes to structure components up to assemblies, PhD Thesis, Université de Grenoble, 2014.
[7] J. J. Shah, D. Anderson, Y. Se Kim, S. Joshi: A Discourse on Geometric Feature Recognition From CAD Models, Journal of Computing and Information Science in Engineering, 2001.
[8] Y. Zhang, X. Luo, Y. Zhao, An Approach to the Automatic Recognition of Boolean Decomposition Loops for Swept Volume Decomposition, 25th International Meshing Roundtable, 2016.
[9] Jonathan Richard Shewchuk, Robust Adaptive Floating-Point Geometric Predicates, 1996.
[10] G. Sharma, R. Goyal, D. Liu, E. Kalogerakis, S. Maji. CSGNet: Neural Shape Parser for Constructive Solid Geometry. The IEEE Conference on Computer Vision and Pattern Recognition (CVPR), 2018.

Paper [1] relates to extracting sufficient information from meshes to build back exact boundary representation (B-Rep) models using mean curvature. By analyzing the curvature on the triangles of a mesh with respect to the overall mesh curvature distribution, sub-meshes are built which are potential candidates to being faces of a B-Rep representation. When the sub-meshes do not touch their neighbors, the proposed approach expands them until some of the limits between adjacent faces can be recovered. The proposed approach expands the sub-meshes by aggregating triangles based on a notion of distance to the already built sub-mesh. With complex and tortuous geometries, the proposed process is not guaranteed to recover valid limits. In the case of a complex mesh geometry the method might thus fail to build a B-Rep. Furthermore, this approach focuses only on reconstructing an exact B-Rep, not an editable feature tree. In the context of building an editable feature tree from a raw mesh, a B-Rep representation is not necessarily an intermediate stage and it might compromise the approach. Going through an intermediate B-Rep representation would fragilize the whole process, in the case of complex geometry. If the B-Rep construction fails, no feature at all would be retrieved.

Paper [2] relates to "process tree" reconstruction starting from B-Rep representations. To build the process tree, the proposed approach analyzes the B-Rep's faces and the intersections between faces to build sketches that can later be extruded. The resulting process tree is limited to solid addition, i.e. no subtraction operations are generated. Since the exact B-Rep is available, the algorithm proceeds iteratively, i.e. feature solids are identified and removed by Boolean operations from the current B-Rep until the whole solid is processed. The proposed approach thus presents the risk of propagating errors.

Paper [8] proposes a method to determine non-planar loops of connected intersection curves/edges that result from successive Boolean operations between swept solids. In order to close the loops, the paper notes that additional virtual intersection curves/edges may have to be created. However, the paper does not detail how to create them. Also, the paper does not go beyond loop detection and, in particular, it does not show how to determine Boolean operations order from loop detection.

Paper [10] proposes a completely different approach for inferring a feature tree representation from a 3D shape, based on a neural network model. The learning is based on a discrete set of candidate leaf solids of the feature tree representation. In addition, the approach requires the input shape to be discretized into a regular voxel grid with limited resolution. The paper does not mention how to obtain a labeled dataset for supervised learning. The proposed approach lacks accuracy.

Within this context, there is still a need for improved solutions for digitization.

SUMMARY

It is therefore provided a computer-implemented (dataset-forming) method for forming a dataset configured for learning a neural network. The neural network is configured for inference, from a discrete geometrical representation of a 3D shape, of an editable feature tree representing the 3D shape. The editable feature tree comprises a tree arrangement of geometrical operations applied to leaf geometrical shapes. The method comprises providing respective data pieces, and inserting a part of the data pieces in the dataset each as a respective training sample. Each data piece includes an editable feature tree representing a 3D shape. The editable feature tree comprises a tree arrangement of geometrical operations applied to leaf geometrical shapes. Each data piece also includes a discrete geometrical representation of the 3D shape. The discrete geometrical representation corresponds to a result of applying the tree arrangement of geometrical operations to the leaf geometrical shapes. The respective 3D shape of each of one or more first data pieces inserted in the dataset is identical to the respective 3D shape of respective one or more second data pieces not inserted in the dataset.

The method may comprise one or more of the following:
  with respect to a discrete set of primitive shape types, and for each primitive shape type, a respective discrete set of one or more parameter domains each of a respective continuous parameter, each parameter domain having respective parameters values of the respective continuous parameter, each leaf geometric shape is formed by a respective primitive shape type, with a respective parameter value for each of the respective discrete set of one or more parameter domains;
  for each of one or more primitive shape types, the one or more respective continuous parameters comprise one or more dimensional parameters and/or one or more positioning parameters;
  the discrete set of primitive shape types comprises a cuboid type, a sphere type, one or more cylinder types, and/or one or more prism types;
  the providing of the respective data pieces comprises: providing initial data including the discrete set of primitive shape types and each respective discrete set of one or more parameter domains, and synthetizing the respective data pieces based on the initial data;
  for each of one or more primitive shape types, the one or more respective continuous parameters comprise one or more dimensional parameters, and the synthetizing comprises: generating at least one initial data piece based on the initial data, including, for each dimensional parameter, selecting a respective parameter value, and then determining at least one ulterior data piece based on the initial data piece, including iteratively, starting from the initial data piece, modifying one or more parameter values each of a respective dimensional parameter and/or deleting one or more leaf geometrical shapes;
  the inserting comprises: providing pairs of respective data pieces each including a third data piece and a fourth data piece, and for each pair: testing an identity between the 3D shape of the third data piece and the 3D shape of the fourth data piece, and identifying one data piece among the third and fourth data pieces as a second data piece upon the testing yielding a positive result;
  the testing comprises: computing a first volume value, the first volume value representing a volume of the discrete geometrical representation of the third data piece, computing a second volume value, the second volume value representing a volume of the discrete geometrical representation of the fourth data piece, and comparing the first volume value to the second volume value;
  for each first data piece, the editable feature tree of the first data piece is structurally compatible to the editable feature tree of each respective second data piece;
  with respect to a discrete set of primitive shape types, and for each primitive shape type, a respective discrete set of one or more parameter domains each of a respective continuous parameter, each parameter domain having respective parameters values of the respective continuous parameter, each leaf geometric shape is formed by a respective primitive shape type, with a respective parameter value for each of the respective discrete set of one or more parameter domains; for each of one or more primitive shape types, the one or more respective continuous parameters consist of one or more dimensional parameters and one or more other parameters, the one or more other parameters including one or more positioning parameters; and a first editable feature tree and a second editable feature tree are structurally compatible when: the tree arrangement of geometrical operations the first editable feature tree at least partially matches the tree arrangement of geometrical operations of the second editable feature tree, and each pair of corresponding leaf geometrical shapes have a same respective primitive shape type, and for each other parameter, a same respective parameter value; and/or
  for each of one or more first data pieces, the inserting comprises selecting the first data piece as a function of canonicity of the editable feature tree of the first data piece.

It is further provided a data structure representing a dataset formable according to the dataset-forming method.

It is further provided a computer-implemented (use) method of use of the dataset. The use method comprises learning a neural network based on the dataset.

It is further provided a computer program comprising instruction for performing the dataset-forming method and/or the use method.

It is further provided a device comprising a data storage medium having recorded thereon the data structure and/or the program. The device may form or serve as a non-transitory computer-readable medium, for example on a SaaS (Software as a service) or other server, or a cloud based platform, or the like. The device may alternatively comprise a processor coupled to the data storage medium. The device may thus form a computer system in whole or in part (e.g. the device is a subsystem of the overall system). The system may further comprise a graphical user interface coupled to the processor.

BRIEF DESCRIPTION OF THE DRAWINGS

Embodiments will now be described, by way of non-limiting example, and in reference to the accompanying drawings, where.

DETAILED DESCRIPTION

Figure 1:
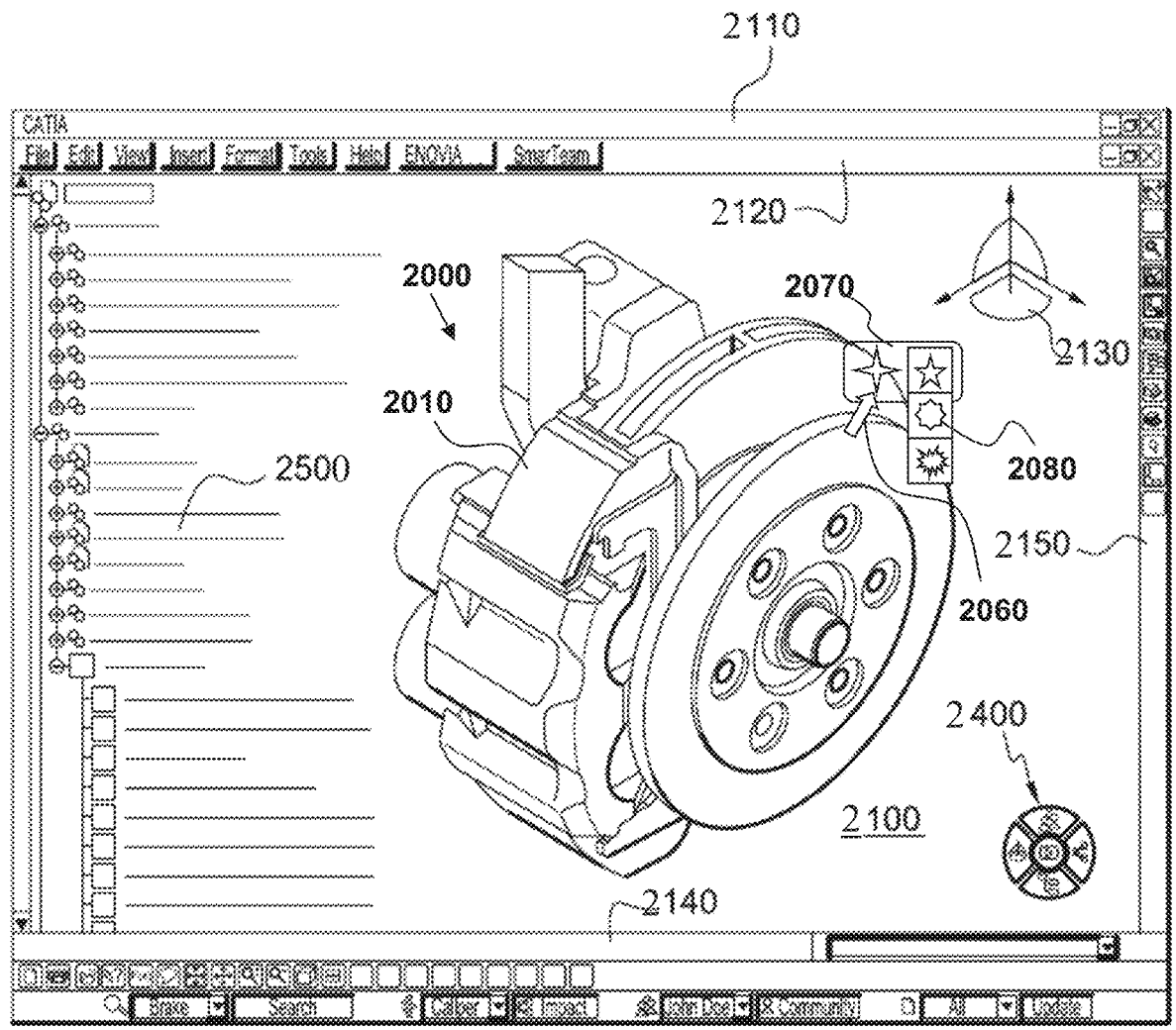
FIG. 1 shows an example of a graphical user interface of the system.

It is hereby proposed computer-implemented methods related to the learning of a neural network. The neural network is herein a function configured to take as an input any one of discrete geometrical representations each of a respective 3D shape, to process the input, and as a result of the processing to output respective data configured for inference of an editable feature tree representing the 3D shape respective to the input. Such a neural network may thus be used for inference of an editable feature tree corresponding to a discrete geometrical representation of a 3D shape.

It is thus proposed a computer-implemented method for performing such an inference, which may be referred to as "the inference method".

The inference method may comprise providing a discrete geometrical representation of a 3D shape. The inference method may further comprise applying the neural network to the discrete geometrical representation of a 3D shape. The inference method may also comprise inferring at least one editable feature tree representing the 3D shape based on a result of the applying (i.e. data output by the neural network when inputted with the discrete geometrical representation). The output data may (directly) include the editable feature tree, and/or be processed to (indirectly) determine the editable feature tree, for example automatically and/or according to a predetermined algorithm.

In the indirect determination case, the output data may for example comprise one or more probability distributions for selecting values that define the at least one editable feature tree, and the predetermined algorithm may for example comprise determining at least one editable feature tree based on the one or more probability distributions. The determining may for example penalize selecting values with a low probability. The determining may for example amount to searching for a predetermined number k (e.g. with k higher or equal to 1 and/or lower than 10) of most probable editable feature tree(s) based on the one or more probability distributions. The searching may be performed according to a beam search algorithm. This provides computation efficiency.

In examples improving accuracy, the inference method may further comprise refining each (initially) inferred editable feature tree, for example automatically. The refining may comprise editing the inferred editable feature tree (for example parameters thereof) in order to make its resulting 3D geometry (e.g. obtainable by "playing" editable feature tree) more similar to the input discrete geometrical representation. The similarity may be increased by minimizing a loss which penalizes a disparity between the 3D geometry provided by the inferred editable feature tree and the input discrete geometrical representation. Minimizing the loss may comprise exploring candidate editions of the initially inferred editable feature tree, for example editions of leaf geometrical shapes thereof. Examples of such editions are provided later. This refinement option improves accuracy by exploiting a fact specific to the context of the present disclosure. Namely, the refinement exploits the fact that an editable feature tree can be used to compute a 3D geometry directly comparable to the discrete geometrical representation, for example by playing the editable feature tree (i.e. applying the geometrical operations of the editable feature tree to the leaf geometrical shapes of the editable feature tree in the order defined by the tree arrangement of the editable feature tree). In other words, accuracy of an output of the neural network can be directly and immediately assessed.

As known from the field of machine-learning, the processing of an input by the neural network includes applying operations to the input, the operations being defined by data including weight values. The learning of the neural network thus includes determining values of the weights based on a dataset configured for such learning. For that, the dataset includes data pieces each forming a respective training sample. The training samples represent the diversity of the situations where the neural network is to be used after being learnt. Any dataset referred herein may comprise a number of training samples higher than 1000, 10000, 100000, or 1000000.

It is thus notably proposed a computer-implemented method for forming such a dataset, which may be referred to as "the dataset-forming method". It is also proposed a computer-implemented method for performing such a learning, which may be referred to as "the learning method".

A machine-learning process may comprise the dataset-forming method and/or the learning method, and optionally the inference method.

A machine-learning process may notably comprise both the dataset-forming method and the learning method. The learning method may for example be performed at least partly based on the dataset formed by the dataset-forming method, in examples after the dataset-forming method. Such a machine-learning process is particularly efficient and provides improved accuracy.

Alternatively, a machine-learning process may comprise the dataset-forming method and performing, based on the dataset, any other computer-implemented method (than the proposed learning method) for learning the neural network. Yet alternatively, a machine-learning process may comprise performing the learning method on a dataset provided by any other computer-implemented method (than the proposed dataset-forming method), such as another method for forming a dataset or a retrieval of a dataset as such.

Before presenting the dataset-forming method and the learning method, data structures involved therein are now discussed. As will be recognized, the data structure definitions and examples provided herein may apply to at least part (e.g. all) of the dataset formed by the dataset-forming method and/or at least part (e.g. all) of the dataset provided in the learning method, and/or to at least one input and/or at least one output of the inference method.

A discrete geometrical representation of a 3D shape is herein a data structure which comprises a discrete set of pieces of data. Each piece of data represents a respective geometrical entity positioned in a 3D space. Each geometrical entity represents a respective location of the 3D shape (in other words, a respective portion of material constitutive of a solid represented by the 3D shape). The aggregation (i.e. union or juxtaposition) of the geometrical entities represents altogether the 3D shape. Any discrete geometrical representation herein may in examples comprise a number of such pieces of data higher than 100 (e.g. higher than 1000).

Any discrete geometrical representation herein may for example be a 3D point cloud, each geometrical entity being a point. Any discrete geometrical representation herein may alternatively be a 3D mesh, each geometrical entity being a mesh tile or face. Any 3D mesh herein may be regular or irregular (i.e. consisting or not of faces of a same type). Any 3D mesh herein may be a polygonal mesh, for example a triangular mesh. Any 3D mesh herein may alternatively be a B-Rep. Any 3D mesh herein may be obtained from a 3D point cloud, for example by triangulating the 3D point cloud (e.g. with a Delaunay triangulation).

Any 3D point cloud herein may be determined from physical measurements on a real object, for example within a 3D reconstruction process (except for when the discrete geometrical representation is synthetically generated, for example during the dataset-forming method). The 3D reconstruction process may comprise providing the real object, providing one or more physical sensors each configured for acquiring a respective physical signal, and acquiring the one or more respective physical signals by operating the one or more physical sensors on the real object (i.e. scanning the real object with each sensor). The 3D reconstruction may then automatically determine a 3D point cloud and/or a 3D mesh based on the measurements, according to any known technique. The one or more sensors may comprise a plurality of (e.g. RGB, and/or image or video) cameras and the determination may comprise a structure-from-motion analysis. The one or more sensors may alternatively or additionally comprise one or more depth sensors (e.g. on an RGB-depth camera) and the determination may comprise a 3D reconstruction from depth data. The one or more depth sensors may for example comprise a laser (e.g. a lidar) or an ultrasound emitter-receiver.

Any 3D point cloud or 3D mesh herein may alternatively be obtained from a 3D modeled object representing a skin (i.e. outer surface) of a solid (e.g. a B-Rep model), for example by ray-casting on the 3D modeled object or tessellating the 3D modeled object. The tessellating may be performed according to any 3D modeled object rendering process. Such a rendering process may be coded on any CAD system in order to display a graphical representation of the 3D modeled object. The 3D modeled object may be designed or have been designed by a user with a CAD system (except for when the discrete geometrical representation is synthetically generated, for example during the dataset-forming method).

A modeled object is any object defined by data stored e.g. in a database. By extension, the expression "modeled object" designates the data itself. According to the type of the system used for designing the modeled object, the modeled objects may be defined by different kinds of data. The system may indeed be any combination of a CAD system, a CAE system, a CAM system, a PDM system and/or a PLM system. In those different systems, modeled objects are defined by corresponding data. One may accordingly speak of CAD object, PLM object, PDM object, CAE object, CAM object, CAD data, PLM data, PDM data, CAM data, CAE data. However, these systems are not exclusive one of the other, as a modeled object may be defined by data corresponding to any combination of these systems. A system may thus well be both a CAD and PLM system.

By CAD system, it is additionally meant any system adapted at least for designing a modeled object on the basis of a graphical representation of the modeled object, such as CATIA. In this case, the data defining a modeled object comprise data allowing the representation of the modeled object. A CAD system may for example provide a representation of CAD modeled objects using edges or lines, in certain cases with faces or surfaces. Lines, edges, or surfaces may be represented in various manners, e.g. non-uniform rational B-splines (NURBS). Specifically, a CAD file contains specifications, from which geometry may be generated, which in turn allows for a representation to be generated. Specifications of a modeled object may be stored in a single CAD file or multiple ones. The typical size of a file representing a modeled object in a CAD system is in the range of one Megabyte per part. And a modeled object may typically be an assembly of thousands of parts.

In the context of CAD, a modeled object may typically be a 3D modeled object, e.g. representing a product such as a part or an assembly of parts, or possibly an assembly of products. By "3D modeled object", it is meant any object which is modeled by data allowing its 3D representation. A 3D representation allows the viewing of the part from all angles. For example, a 3D modeled object, when 3D represented, may be handled and turned around any of its axes, or around any axis in the screen on which the representation is displayed. This notably excludes 2D icons, which are not 3D modeled. The display of a 3D representation facilitates design (i.e. increases the speed at which designers statistically accomplish their task). This speeds up the manufacturing process in the industry, as the design of the products is part of the manufacturing process.

The CAD system may be history-based. In this case, a modeled object may be further defined by data comprising a history of geometrical features. A modeled object may indeed be designed by a physical person (i.e. the designer/user) using standard modeling features (e.g. extrude, revolute, cut, and/or round) and/or standard surfacing features (e.g. sweep, blend, loft, fill, deform, and/or smoothing). Many CAD systems supporting such modeling functions are history-based system. This means that the creation history of design features is typically saved through an acyclic data flow linking the said geometrical features together through input and output links. The history based modeling paradigm is well known since the beginning of the 80's. A modeled object may be described by two persistent data representations: history and B-rep (i.e. boundary representation). The B-rep is the result of the computations defined in the history. The shape of the part displayed on the screen of the computer when the modeled object is represented is (e.g. a tessellation of) the B-rep. The history of the part is the design intent. Basically, the history gathers the information on the operations which the modeled object has undergone. The B-rep may be saved together with the history, to make it easier to display complex parts. The history may be saved together with the B-rep in order to allow design changes of the part according to the design intent.

The inference method allows retrieving such a history of geometrical features via the editable feature tree, when fed with a discrete geometrical representation of a 3D shape not accompanied by any such history (for example because the history was not saved, or the discrete geometrical representation or B-Rep is received from a distant system or retrieved on a database without the history).

Any 3D shape herein may represent the geometry of a product to be manufactured in the real world, such as a (e.g. mechanical) part or assembly of parts (or equivalently an assembly of parts, as the assembly of parts may be seen as a part itself from the point of view of the methods, or the methods may be applied independently to each part of the assembly), or more generally any rigid body assembly (e.g. a mobile mechanism). The product may be one of products in various and unlimited industrial fields, including: aerospace, architecture, construction, consumer goods, high-tech devices, industrial equipment, transportation, marine, and/or offshore oil/gas production or transportation. The 3D shape may thus represent an industrial product which may be any mechanical part, such as a part of a terrestrial vehicle (including e.g. car and light truck equipment, racing cars, motorcycles, truck and motor equipment, trucks and buses, trains), a part of an aerial vehicle (including e.g. airframe equipment, aerospace equipment, propulsion equipment, defense products, airline equipment, space equipment), a part of a naval vehicle including e.g. navy equipment, commercial ships, offshore equipment, yachts and workboats, marine equipment), a general mechanical part (including e.g. industrial manufacturing machinery, heavy mobile machinery or equipment, installed equipment, industrial equipment product, fabricated metal product, tire manufacturing product), an electro-mechanical or electronic part (including e.g. consumer electronics, security and/or control and/or instrumentation products, computing and communication equipment, semiconductors, medical devices and equipment), a consumer good (including e.g. furniture, home and garden products, leisure goods, fashion products, hard goods retailers' products, soft goods retailers' products), a packaging (including e.g. food and beverage and tobacco, beauty and personal care, household product packaging).

As known from the field of CAD, an editable feature tree is herein an editable data structure which comprises data representing a tree arrangement of geometrical operations applied to leaf geometrical shapes. Each leaf node of the tree arrangement represents a respective leaf geometrical shape, and each non-leaf node of the tree arrangement represents a respective geometrical operation, also called "feature", to be applied to its child node(s). Applying the tree arrangement of geometrical operations to the leaf geometrical shapes thus amounts to starting with the leaf geometrical shapes, and successively applying the geometrical operation of each non-leaf node following the tree arrangement. The 3D shape represented by the editable feature tree corresponds to the result of the root node(s) of the editable feature tree.

The leaf geometrical shapes may be of any type. The leaf geometrical shapes may, for example, each comprise (e.g. consist of) a respective 3D shape, such as a respective 3D solid. The geometrical operations may be of any type. In examples, the geometrical operations are all of a same type, for example all the addition/union operation. In such examples, the inference method may be configured to infer editable feature trees restricted to those with only said single type of geometrical operation. In alternative and finer examples, the geometrical operations may comprise operations of different types, for example different Boolean operation types (i.e. binary and continuous operators e.g. which, to two 3D shapes, associate a new 3D shape), including the addition union operation type, the subtraction operation type, and/or the intersection operation type. In such examples, the inference method may be configured to infer editable feature trees with all types of geometrical operations available. Any editable feature tree herein may notably be a Constructive Solid Geometry (CSG) tree, known from the field of solid modeling. In particularly accurate examples, the inference method is configured to infer CSG trees only. The tree arrangement may be of any type. Any editable feature tree herein may notably be a single-rooted tree, a binary tree, and/or a full binary tree (i.e. a binary tree of the type where each non-leaf node has at least one leaf node as a child). In particularly efficient examples, the inference method is configured to infer trees presenting such arrangement type only. As will be recognized, the inference method may be configured to infer editable feature trees restricted to some conditions via a corresponding neural network architecture being provided to the learning method.

Each leaf geometrical shape of an editable feature tree is selectable and editable by a user. In case of an editable feature tree where the geometrical operations may comprise operations of different types, one or more of the geometrical operations may in examples be selectable and editable by the user. In alternative examples, the geometrical operations are not editable. In all examples, branches of the editable features tree may be deleted and/or branches may be added. A branch is itself a tree arrangement of geometrical operations applied to leaf geometrical shapes.

Edition of a leaf geometrical shape or of a geometrical operation may be performed by a user in any manner known from the field of CAD, such as comprising selection of at least one parameter thereof having a current parameter value and modification of said parameter value. Such edition presents ergonomics characteristics compared to edition of a discrete geometrical representation such as a raw mesh. In particular, an inferred editable feature tree may comprise a number of leaf geometrical shapes lower than the number of discrete geometrical entities of an input mesh by a factor higher than 5 (e.g. higher than 10), and/or a number of leaf geometrical shapes lower than 100 (e.g. lower than 50). Each leaf geometrical shape may be defined by a number of parameters lower than 20 (e.g. lower than 10). The editable feature tree thus represents the 3D shape in a more compact and organized manner compared to the discrete geometrical representation. Also, as known from the field of CAD, acting on a single parameter of the editable feature tree may present a global impact, while in the case of a discrete geometrical representation acting on a single geometrical entity only presents a local impact. For example, any editable feature tree herein may be configured for scaling up a (e.g. curved, for example cylindrical) part or a whole of the 3D shape by modifying a number of parameter values inferior to 5 (e.g. inferior to 3), as opposed to moving/increasing a high number of mesh triangles. In addition, an editable feature tree is semantically more meaningful to a user than a discrete geometrical representation.

In examples, the inference method may comprise displaying a graphical representation of the editable feature tree, including a tree arrangement of graphical items representing each a corresponding leaf geometrical shape or geometrical operation. The edition may comprise selecting a graphical item, for example by graphical-interaction. Graphical-interaction herein means operating a haptic device to activate pixels at a location corresponding to the position of the graphical item on the display. For example, a mouse cursor may be positioned over the displayed graphical item, or the displayed graphical item may be touched directly via a touch screen or indirectly via a touch pad. The selection may trigger opening of a dialog box or the like, and entering one or more parameter values by the user, for example via a keyboard.

In examples, the inference method may comprise displaying a graphical representation of the discrete geometrical representation, and meanwhile, by a user, launching the application of the neural network and inference of the editable feature tree, and as a result, displaying the graphical representation of the editable feature tree simultaneously to the graphical representation of the discrete geometrical representation. The user may then hide the graphical representation of the discrete geometrical representation for edition of the editable feature tree. Alternatively, the inference method may continue to display both graphical representations simultaneously, and upon the user performing an edition, the method may update (e.g. change) the graphical representation of the discrete geometrical representation accordingly. This provides visual feedback to the user performing editions.

In examples, the inference method is configured for taking as input a 3D mesh or 3D point cloud determined from physical measurements on a real object, and the inference method allows determining a corresponding editable feature tree representing the 3D shape of the real object. A user may then perform editions of the editable feature tree, for example to create a design resembling the real object but different therefrom. In alternative and additional examples, the inference method is configured for taking as input a 3D mesh of a 3D modeled object having no corresponding editable feature tree, received from a distant computer system or retrieved from non-volatile memory, and the inference method allows determining a corresponding editable feature tree representing the 3D shape. A user may then perform editions of the editable feature tree, for example to create a design resembling the 3D mesh but different therefrom, or to complete the design formed by the 3D mesh.

In addition or alternatively to the possibility of performing editions of the 3D shape in a more ergonomic manner, the obtention of an editable feature tree may serve other purposes, such as 3D shape merging or mechanical simulation.

A 3D shape merging method may comprise providing, at a computer system, a first editable feature tree representing a first 3D shape, providing a discrete geometrical representation of a second 3D shape, performing the inference method on the discrete geometrical representation to obtain a second editable feature tree representing the second 3D shape, and merging the first editable feature tree and the second editable feature tree. The merging may be performed according to any merging technique and/or to represent a mechanical assembly or a mechanical cooperation between the first 3D shape and the second 3D shape. The merging may for example comprise connecting the second tree to the first tree. The 3D shape merging method may further comprise applying a geometric model to the merged tree so as to obtain a graphical representation of the 3D shape thereby represented, and/or display said graphical representation to a user.

A mechanical simulation may be performed based on the editable feature tree. Indeed, since the editable feature tree represents the 3D shape in a compact (relative to the discrete geometrical representation) and parameterized manner, mechanical computations may be performed more accurately on an editable feature tree. In particular, it is easier and more direct to calculate a finite element mesh from a CSG (as taught by paper "Finite-element mesh generation from constructive-solid-geometry models", Edwin Boender, Willem F. Bronsvoort, Frits H. Post, in Computer-Aided Design, Volume 26, Issue 5, May 1994, Pages 379-392 or by paper "Finite element mesh generation methods: a review and classification", K Ho-Le, in 38 Computer-Aided Design, volume 20 number 1 January/February 1988). In addition, the CSG offers guarantees of waterproofness of the surface. The mechanical simulation may thus comprise computing one or more finite element meshes from the editable feature tree (e.g. CSG) and/or one or more modifications thereof, and then performing a finite element analysis based on each finite element mesh. Also, one can easily optimize a CSG according to the results of simulation since the CSG is parameterized. Thus, the one or more modifications may be for optimizing the editable feature tree (e.g. CSG) based on each previous finite element analysis result.

The dataset-forming method and the learning method are now presented in general.

The dataset-forming method comprises providing respective data pieces. Each respective data piece includes an editable feature tree representing a 3D shape. The editable feature tree comprises a tree arrangement of geometrical operations applied to leaf geometrical shapes. Each respective data piece further includes a discrete geometrical representation of the 3D shape. The discrete geometrical representation corresponds to a result of applying the tree arrangement of geometrical operations to the leaf geometrical shapes. The dataset-forming method further comprises inserting a part of the data pieces in the dataset as training samples. The respective 3D shape of each of one or more first data pieces inserted in the dataset is identical to the respective 3D shape of respective one or more second data pieces not inserted in the dataset.

By "providing a respective data piece", it is meant that at least at some point of the dataset-forming method, the data piece is recorded on memory of the computer system and accessible to the processor.

By "dataset", it is meant any data structure comprising training samples and configured for machine-learning, the data structure being recorded on memory of the computer system and accessible to the processor. The dataset-forming method may comprise recording the dataset on non-volatile memory.

By "inserting" or "not inserting" a data piece in the dataset as a training sample, it is meant that at least at some point (e.g. the end) of the dataset-forming method, the dataset is recorded on (e.g. non-volatile) memory of the computer system in a state where the dataset includes all "inserted" data pieces (i.e. which are thus recorded on the memory within the data structure representing the dataset) while the dataset excludes (i.e. does not comprise) all "not inserted" data pieces (i.e. which are thus not recorded on the memory, at least within the data structure representing the dataset). Thus, at least at said point and with respect to a same dataset recorded on a memory location, all the first data pieces are simultaneously recorded while none of the second data pieces is recorded. A learning may then be based on the dataset, in examples after a further processing of the dataset. The learning may involve (e.g. substantially only) first data pieces (e.g. substantially all first data pieces) and substantially no second data piece. The learnt neural network will thus be consistent with the first data pieces not with the second data pieces.

The dataset-forming method forms an improved solution for digitization. The formed dataset comprises training samples each including a discrete geometrical representation of a respective 3D shape and a respective editable feature tree representing the 3D shape. The dataset is thus configured for learning a neural network usable for converting a discrete geometrical representation into an editable feature tree representing, in examples with the proposed learning method. In addition, the dataset is labeled with respect to the contemplated learning. Indeed, potential inputs of the neural networks (discrete geometrical representations) are each labeled in the dataset by a ground truth output (a respective editable feature tree). Thus, the learning may be supervised and thus particularly efficient. Furthermore, the dataset is not populated with all provided data pieces. Rather, among the training samples, there are one or more (first) data pieces respective to a 3D shape identical to the respective 3D shape of one or more (second) data pieces provided but not part of the training samples. Such filtering-out of the second data pieces improves the learning. Indeed, at best, the second data pieces form redundant information relative the first data pieces. At worst, the second data pieces form inconsistent information relative to the first data pieces, thereby perturbating the learning. The filtering-out may be referred to as "redundancy" reduction/management.

The learning method comprises providing a dataset including discrete geometrical representations each of a respective 3D shape. The learning method further comprises providing a candidate set of leaf geometrical shapes. The learning method also comprises learning the neural network based on the dataset and on the candidate set. The candidate set comprises at least one continuous subset of leaf geometrical shapes.

By "providing a candidate set of leaf geometrical shapes", it is meant that the learning method, and in particular the learning step, is enabled to consider each element of said candidate set as a candidate for inference (at least at some point). As known from the field of machine-learning, the learning step may comprise setting the weight values of the neural network freely such that the inference method tends to perform inference consistent with the dataset fed to the learning method. And by "providing a candidate set of leaf geometrical shapes", it is meant that the neural network architecture is predetermined in a way and the learning step is performed in a manner such that each element of the candidate set is available for being potentially inferred during inference. In examples, each element of the candidate set is a candidate for each inferred leaf geometrical shape (i.e. whichever the position in the tree arrangement).

By "continuous", it is meant that each candidate leaf geometrical shape of the subset can be obtained by a particular continuous deformation (e.g. parameterized with a fixed number of parameters) of another candidate leaf geometrical shape of the subset, such that each intermediate state of the continuous deformation is itself a candidate leaf geometrical shape of the subset. In examples, the candidate set of leaf geometrical shapes comprises several continuous subsets (e.g. one per primitive shape type).

The learning method forms an improved solution for digitization. Notably, the learnt neural network is usable for converting a discrete geometrical representation into an editable feature tree. In the context of digitization, this particularly useful as already discussed. In addition, performing such a digitization with a learnt neural network allows achieving benefits provided by the field of machine-learning, such as fast or real-time execution, non-requirement of tedious prior manual programming/coding, and accuracy of the result (e.g. the accuracy here referring to the value of a 3D similarity evaluated between the result of playing the output editable feature tree and the input discrete geometrical representation). The learning method thus improves ergonomics in the context of 3D design. Furthermore, the candidate set of leaf geometrical shapes comprises, contrary to the solution proposed in paper [10], at least one continuous subset of leaf geometrical shapes. This improves accuracy of the learning. Indeed, since at least one continuum of 3D shapes are all accessible for becoming leaves of an inferred editable feature tree, the inference can be performed in a fine manner within such continuum.

The learning may comprise a supervised training, based on at least part of the dataset. In such a case, said at least part of the dataset includes, for each discrete geometrical representation, a respective editable feature tree forming with the discrete geometrical representation a (labeled) training sample. Said at least part of the dataset may be provided according to any method, for example formed according to the dataset-forming method.

Alternatively or additionally, the learning may comprise an unsupervised training, based on at least another part of the dataset. In such a case, the discrete geometrical representations of said at least another part of the dataset each form a respective (unlabeled) training sample. Said at least another part of the dataset may be provided according to any method, for example retrieved as a commercial database of discrete geometrical representations.

In particularly efficient examples, the learning method may comprise a supervised training based on the dataset formed by the dataset-forming method. In robust examples of such examples, the learning may further comprise an unsupervised training based on another dataset, for example after the supervised training. As known from the field of machine-learning, each training may comprise iteratively processing a respective dataset, for example mini-batch-by-mini-batch, and modifying weight values of the neural network along the iterative processing. This may be performed according to a stochastic gradient descent. The weight values may be initialized in any way for each training. In examples, the weight values of the unsupervised training may be initialized with the weight values obtained at the end of the supervised training. The weight values may be initialized for the supervised training in any arbitrary manner, for example randomly or each to the zero value. The dataset-forming method and the supervised training thus form a way to initialize weight values for a further training, namely the unsupervised training, which may be based on another dataset. The other dataset may for example be an unlabeled dataset more representative of reality than the labeled dataset formed by the dataset-forming method. The unsupervised training may thus lead to a more accurate result compared to stopping after the supervised training. However, as known from the field of machine-learning, an unsupervised training can be very long and provide an inaccurate result if arbitrarily initialized. In the proposed approach, the supervised learning provides a relatively good initialization.

The methods are computer-implemented.

This means that steps (or substantially all the steps) of the methods are executed by at least one computer, or any system alike. Thus, steps of the methods are performed by the computer, possibly fully automatically, or, semi-automatically. In examples, the triggering of at least some of the steps of the method may be performed through user-computer interaction. The level of user-computer interaction required may depend on the level of automatism foreseen and put in balance with the need to implement user's wishes. In examples, this level may be user-defined and/or pre-defined.

This also means that the neural network, the dataset, one or more (e.g. all) inputs and/or one or more (e.g. all) outputs may each be represented by a respective data structure. One or more (e.g. all) data structures may each be non-transitorily recorded on a respective data storage medium.

A typical example of computer-implementation of a method is to perform the method with a system adapted for this purpose. The system may comprise a processor coupled to a memory and a graphical user interface (GUI), the memory having recorded thereon a computer program comprising instructions for performing the method. The memory may also store a database. The memory is any hardware adapted for such storage, possibly comprising several physical distinct parts (e.g. one for the program, and possibly one for the database). The system may be a CAD system.

FIG. 1 shows an example of the GUI of any system herein, wherein the system is a CAD system.

The GUI 2100 may be a typical CAD-like interface, having standard menu bars 2110, 2120, as well as bottom and side toolbars 2140, 2150. Such menu- and toolbars contain a set of user-selectable icons, each icon being associated with one or more operations or functions, as known in the art. Some of these icons are associated with software tools, adapted for editing and/or working on the 3D modeled object 2000 displayed in the GUI 2100. The software tools may be grouped into workbenches. Each workbench comprises a subset of software tools. In particular, one of the workbenches is an edition workbench, suitable for editing geometrical features of the modeled product 2000. In operation, a designer may for example pre-select a part of the object 2000 and then initiate an operation (e.g. change the dimension, color, etc.) or edit geometrical constraints by selecting an appropriate icon. For example, typical CAD operations are the modeling of the punching or the folding of the 3D modeled object displayed on the screen. The GUI may for example display data 2500 related to the displayed product 2000. In the example of the figure, the data 2500, displayed as a "feature tree", and their 3D representation 2000 pertain to a brake assembly including brake caliper and disc. The GUI may further show various types of graphic tools 2130, 2070, 2080 for example for facilitating 3D orientation of the object, for triggering a simulation of an operation of an edited product or render various attributes of the displayed product 2000. A cursor 2060 may be controlled by a haptic device to allow the user to interact with the graphic tools.

The 3D modeled object 2000 may be a graphical representation of a discrete geometrical representation of a 3D shape, and the inference method may allow determining the editable feature tree 2500. The inference method thus allows starting from a discrete geometrical representation 2000 of a 3D shape with no feature tree associated thereto, and then retrieving an editable feature tree 2500. This allows using all capabilities of the CAD system.

Figure 2:
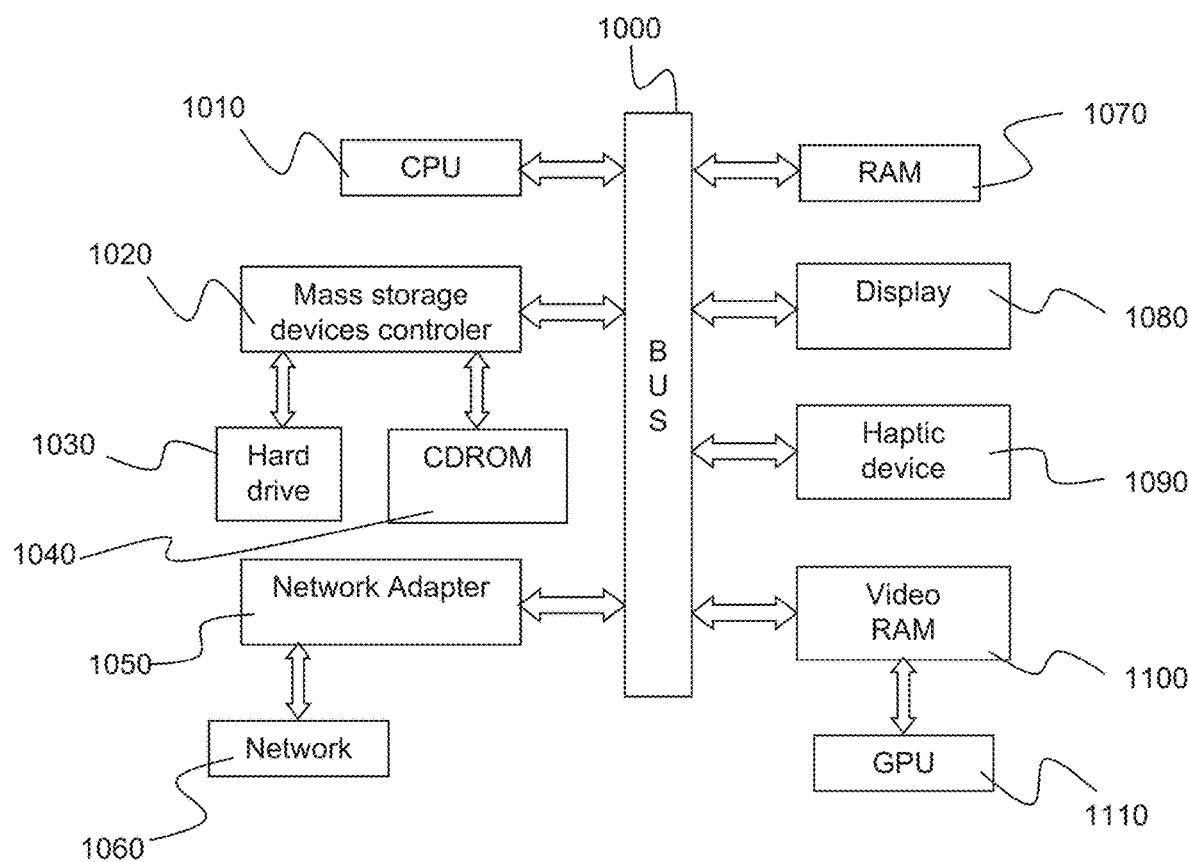
FIG. 2 shows an example of the system.

FIG. 2 shows an example of any system herein, wherein the system is a client computer system, e.g. a workstation of a user.

The client computer of the example comprises a central processing unit (CPU) 1010 connected to an internal communication BUS 1000, a random access memory (RAM) 1070 also connected to the BUS. The client computer is further provided with a graphical processing unit (GPU) 1110 which is associated with a video random access memory 1100 connected to the BUS. Video RAM 1100 is also known in the art as frame buffer. A mass storage device controller 1020 manages accesses to a mass memory device, such as hard drive 1030. Mass memory devices suitable for tangibly embodying computer program instructions and data include all forms of nonvolatile memory, including by way of example semiconductor memory devices, such as EPROM, EEPROM, and flash memory devices; magnetic disks such as internal hard disks and removable disks; magneto-optical disks; and CD-ROM disks 1040. Any of the foregoing may be supplemented by, or incorporated in, specially designed ASICs (application-specific integrated circuits). A network adapter 1050 manages accesses to a network 1060. The client computer may also include a haptic device 1090 such as cursor control device, a keyboard or the like. A cursor control device is used in the client computer to permit the user to selectively position a cursor at any desired location on display 1080. In addition, the cursor control device allows the user to select various commands, and input control signals. The cursor control device includes a number of signal generation devices for input control signals to system. Typically, a cursor control device may be a mouse, the button of the mouse being used to generate the signals. Alternatively or additionally, the client computer system may comprise a sensitive pad, and/or a sensitive screen.

Any computer program herein may comprise instructions executable by a computer, the instructions comprising means for causing the above system to perform the method. The program may be recordable on any data storage medium, including the memory of the system. The program may for example be implemented in digital electronic circuitry, or in computer hardware, firmware, software, or in combinations of them. The program may be implemented as an apparatus, for example a product tangibly embodied in a machine-readable storage device for execution by a programmable processor. Method steps may be performed by a programmable processor executing a program of instructions to perform functions of the method by operating on input data and generating output. The processor may thus be programmable and coupled to receive data and instructions from, and to transmit data and instructions to, a data storage system, at least one input device, and at least one output device. The application program may be implemented in a high-level procedural or object-oriented programming language, or in assembly or machine language if desired. In any case, the language may be a compiled or interpreted language. The program may be a full installation program or an update program. Application of the program on the system results in any case in instructions for performing the method.

Any method herein may be part of a process for designing a 3D modeled object. "Designing a 3D modeled object" designates any action or series of actions which is at least part of a process of elaborating a 3D modeled object. Thus, the method may comprise creating the 3D modeled object from scratch. Alternatively, the method may comprise providing a 3D modeled object previously created, and then modifying the 3D modeled object.

Any method herein may be included in a manufacturing process, which may comprise, after performing the method, producing a physical product corresponding to the modeled object. In any case, the modeled object designed by the method may represent a manufacturing object. The modeled object may thus be a modeled solid (i.e. a modeled object that represents a solid). The manufacturing object may be a product, such as a part, or an assembly of parts. Because the method improves the design of the modeled object, the method also improves the manufacturing of a product and thus increases productivity of the manufacturing process.

Examples of leaf geometrical shapes are now discussed.

One or more (e.g. all) leaf geometrical shapes provided in the dataset-forming method (as part of the editable feature tree of a respective data piece), one or more (e.g. all) candidate leaf geometrical shapes provided in the learning method, and/or one or more (e.g. all) leaf geometrical shapes provided by the inference method (as part of the inferred editable feature tree) may each be in line with these examples.

Given a discrete set of primitive shape types and, for each primitive shape type, a respective discrete set of one or more parameter domains each of a respective continuous parameter, where each parameter domain has respective parameters values of the respective continuous parameter, a leaf geometric shape may be formed by a respective primitive shape type, with a respective parameter value for each of the respective discrete set of one or more parameter domains.

Thus, the dataset-forming method and/or the learning method may be based on such a discrete set of primitive shape types, and, for each primitive shape type, on such a respective discrete set of one or more parameter domains.

The sets may be the same or different for the dataset-forming method and the learning method. In case the sets are the same, the machine-learning process is particularly accurate, since the leaf geometrical shapes of the training samples are consistent with the leaf geometrical shapes candidate for inference.

Now, the candidate set of leaf geometrical shapes in the learning method may comprise a set product between the discrete set of primitive shape types, and for each primitive shape type, the respective discrete set of one or more parameter domains. Each element of the set product represents a respective candidate leaf geometrical shape.

In the case of the dataset-forming method, each leaf geometrical shape of a training sample may belong to such a set product. In examples, the dataset-forming method may comprise providing initial data including (data representative of) the discrete set of primitive shape types, and, for each primitive shape type, (data representative of) the respective discrete set of one or more parameter domains. In such examples, leaf geometrical shapes may be provided (e.g. synthetized) based on such initial data.

By "primitive shape type" it is meant a class of geometrical shapes (e.g. solids) where each geometrical shape presents a common general form (e.g. recognizable as such to a user). A primitive shape type is associated with parameters. Each parameter takes values in a set called "parameter domain" (which may be an interval, i.e. a continuous range of real numbers), and providing a particular parameter value for each parameter domain defines an instance of the primitive shape type. A primitive shape type may be defined by a respective set of one or more parameters and a predetermined algorithm configured for generating such a geometrical shape instance of the primitive shape type when fed with parameter values for the respective set. Said instance forms a leaf geometrical shape which can intervene in one or more editable feature trees.

The primitive shape types may be associated each with one or more continuous parameters. By "continuous" for a parameter, it is meant that the function outputting the leaf geometrical shape is continuous at least piecewise with respect to the parameter. It can also be said that the parameter domain is continuous at least piecewise. This allows a compact representation of a great diversity of shapes.

In examples, for each of one or more primitive shape types, the one or more respective continuous parameters comprise one or more dimensional parameters and/or one or more positioning parameters. Dimensional parameters are parameters that define the size of characteristic dimensions of a shape of a given primitive shape type. Dimensional parameters may be specific per primitive shape type. Positioning parameters are parameters that allow positioning of the shape in a 3D space. Positioning parameters may be the same for all primitive shape types, for example (x,y,z) coordinates defined relative to a (0,X,Y,Z) referential.

In particularly efficient examples in terms of computation time and/or convergence for the learning Versus representativity of the diversity of real situations, the discrete set of primitive shape types may comprise a cuboid type, a sphere type, one or more cylinder types, and/or one or more prism types. In examples, the discrete set of primitive shape types may comprise any one or any combination (e.g. all) of the following types:

cuboid, e.g. parameterized by three positioning parameters and three dimensional parameters;

sphere, e.g. parameterized by three positioning parameters and one dimensional parameter (diameter);

right circular cylinder oriented along the X, Y or Z axis (thus corresponding to three primitive shape types), e.g. parameterized by three positioning parameters, one dimensional parameter representing height, and one dimensional parameter representing diameter;

straight prism with isosceles trapezoidal base oriented along the axes (X, Y), (X, Z), (Y, Z), (Y, X), (Z, X), (Z, Y) (thus corresponding to six primitive shape types), e.g. parameterized by three positioning parameters, one dimensional parameter representing length of the large trapezoid base, one dimensional parameter representing length of the small trapezoid base, one dimensional parameter representing height of the trapezium, one dimensional parameter representing depth of the prism.

The discrete set of primitive shape types may comprise any other primitive shape type, such as unoriented cylinder with three more rotation parameters, polygonal base cylinder, non-straight cylinder, polygonal base prism, non-oriented prism, and/or non-regular polyhedra.

Any leaf geometrical shape provided herein (e.g. on a memory) may be recorded (e.g. within a provided data piece, a training sample and/or an output of the inference) as a data structure including a datum (e.g. textual information) representative of the primitive shape type, and for each parameter, a respective datum (e.g. a value, such as a floating point) representative of the parameter value.

Examples of the dataset-forming method are now discussed.

In first examples, the inserting may comprise, for each of one or more (e.g. all) first data pieces (i.e. inserted in the dataset), selecting the first data piece as a function of a canonicity of the editable feature tree of the first data piece. For example, for each of one or more (e.g. all of the) first data pieces, the editable feature tree of the first data piece is more canonical than the editable feature tree of each of one or more (e.g. substantially, e.g. all of the) respective second data pieces (i.e. not inserted in the dataset). By more "more canonical" for a first editable feature tree representing a 3D shape relative to a second editable feature tree representing an identical 3D shape, it is meant that the sum of sizes (e.g. volumes) of the leaf geometrical shapes (e.g. solids) of the first editable feature tree is lower (or equal) than the sum of sizes (e.g. volumes) of the leaf geometrical shapes (e.g. solids) of the second editable feature tree. By "substantially", it is meant that the inserting may aim at maximizing canonicity of the first data pieces each relative to their respective second data pieces, but that decisions may seldom be non-optimal such that sometimes the true minimum is not reached. Providing high canonicity of the training samples' editable feature trees improves accuracy of the learning, by reducing (e.g. avoiding) ambiguities that could be raised in case non-canonicity were authorized.

In second examples combinable with the first examples, the providing of respective data pieces may comprise synthetizing data pieces.

By "synthetizing", it is meant an automatic process that includes generating the editable features tree and the discrete geometrical representation. In examples, the method may first synthetize an editable features tree, and then determine the discrete geometrical representation (including) by applying the tree arrangement of geometrical operations to the leaf geometrical shapes. The dataset-forming method may for example comprise providing a predetermined scheme for playing an editable feature tree, and determining the discrete geometrical representation may be performed automatically by applying the scheme to the editable feature tree. The method may also optionally further add noise to one or more discrete geometrical representations (e.g. a Perlin noise). This allows obtaining a more realistic discrete geometrical representation, and thus improves robustness of the learning.

The synthetizing may be suboptimal (in terms of redundancy and/or canonicity of its elements), Thus, at least some of the synthetized data pieces may be filtered-out and thereby not inserted in the dataset, optionally after determining based on them other data pieces (e.g. with at least one such other data piece eventually inserted in the dataset), In other words, the dataset is not populated with all synthetized data, but rather with a selected strict part thereof.

In a first option of such second examples (said first option being also applicable in other examples than the second examples), the filtering-out may comprise providing pairs of (third and fourth) data pieces and testing an identity between the 3D shapes of at least one (e.g. each) pair (third and fourth) data pieces. The test may be predetermined and define the identical character between a pair of 3D shapes: a pair of 3D shapes is considered identical if the test between their representative data pieces is positive. Thus, upon the testing yielding a positive result (and thus determination that the third and fourth data pieces are redundant), the filtering-out may identify a data piece among the third and fourth data pieces as a second data piece (not to be inserted in the dataset) and thereby filtering-out said second data. The identified data piece may optionally be the least canonical one (i.e. the data piece having the least canonical editable feature tree).

In a second option of the second examples combinable with the first option, the data pieces may comprise one or more (e.g. distinct and/or non-intersecting) groups of data pieces, all data pieces of a respective group representing a same 3D shape. In other words, all editable feature trees of each group lead to discrete geometrical representations representing an identical 3D shape. In such cases, the dataset-forming method may retain for insertion in the dataset, for at least one (e.g. each) group, only one or more (e.g. a single one) data pieces as training samples, optionally as a function of canonicity (e.g. one(s) having a most canonical editable feature tree), and discarding/deleting (i.e. not including in the dataset) any other data pieces of the group.

In specific examples of the second option, the group may be processed as in the first option, that is, with a 'pair of data pieces'-wise processing including a testing step. In such examples, the group and the pairs may be provided in any manner. For example, the processing may have no prior knowledge of the group. In such a case, the testing allows ensuring that the third and fourth data pieces are in the same group.

For example, the synthetizing may comprise generating at least one initial data piece, and then determining at least one ulterior data piece based on the initial data piece. Each initial data piece and its ulterior data piece(s) form a respective group. The determining of the ulterior data piece(s) may include iteratively, starting from the initial data piece, performing a step of editable feature tree edition, the output of each iteration (of the step of editable feature tree edition) forming an ulterior data piece. By "iteratively, starting from the initial data piece" it is meant that the step of editable feature tree edition is repeated one or more times, using at each time t, as input, the output of a prior time, and that the initial (i.e. starting/first) input (at the initial time t=0) is the editable feature tree of the initial data piece. At each iteration, the prior time may be the previous time (i.e. corresponding to the preceding iteration, that is, t−1) or any other prior time (such as the initial time t=0). The iteration may correspond to a blind exploration of the group, e.g. aiming at finding the most canonical data piece(s) to determine as first data piece(s) that is(are) to be inserted in the dataset. Synthetizing and providing the data pieces iteratively increases efficiency in terms of computation, compared to providing a raw (unorganized) set of synthetized data pieces. Indeed, proceeding iteratively with the synthetization allows to organize the data pieces and naturally work group-by-group, thereby at least reducing unnecessary tests, compared to proceeding randomly (and thus brutally) on already-synthetized but unorganized data.

In particular, the testing may be performed interlaced with the synthetizing. For example, the testing may be performed (e.g. substantially only) after each step of editable feature tree edition. In such examples, the third data piece may be the ulterior data piece determined at the current time, and/or the fourth data piece may be another available data piece, such as the initial data piece or an ulterior data piece determined at a prior time, for example the data piece inputted to the current step of editable feature tree edition. The testing allows to know whether or not the iteration stayed in the group, in other words, whether or not the step of editable feature tree edition modified the represented 3D shape. If the testing yields a positive result, the filtering-out may be performed as above, and the iteration may continue (for example to yet explore the group). In other words, the filtering-out is interlaced with the synthetizing, and thereby follows the order of the synthetizing. Alternatively if the testing yields a negative result, then it means that the third data piece does not belong to the group. In such case, the third data piece may be either be deleted/discarded or alternatively kept for any purpose (to be inserted in the dataset, or to launch another separate iteration starting therefrom in order to explore a separate group). In any case, the third data piece is discarded from the present iteration, which may continue, for example by going back to the fourth data piece and performing a different editable feature tree edition.

The processing of one group (e.g. including generating an initial data piece respective to the group) according to the second option has been discussed. In examples of the second option, the same processing may be performed for at least one (e.g. each) other group (e.g. including generating an initial data piece respective to each other group). All groups may be processed in parallel or sequentially.

In third examples combinable with the first and/or second examples, for each first data piece (i.e. inserted in the dataset), the editable feature tree of the first data piece may be structurally compatible to (e.g. and more canonical than) the editable feature tree of each respective second data piece (i.e. corresponding to the first data piece and not inserted in the dataset). A first editable feature tree and a second editable feature tree are considered "structurally compatible" when they potentially yield identical 3D shapes. The "structural compatibility" may correspond to any predetermined tree structural compatibility criterion. For example, a first editable feature tree and a second editable feature tree may be considered "structurally compatible" when they at least partially match one another. The predetermined tree structural compatibility criterion may measure an extent to which elements of the two editable feature trees are the same. Indeed, two editable features which have a high number of identical elements potentially yield identical 3D shapes. Two editable features which are identical are necessarily structurally compatible. However, two editable feature trees which are structurally compatible may be either identical or different. The third examples improve efficiency.

For example, in the first option of the second examples, for one or more (e.g. all) 'pair of data pieces'-wise processes including a testing step, the third and fourth data pieces may be structurally compatible (i.e. have structurally compatible editable feature trees). This allows performing the testing only in situations where a positive result is particularly likely, thereby improving efficiency.

Alternatively or additionally, still in the first option of the second examples, the testing may comprise a volume comparison scheme. The volume comparison scheme may comprise computing a first volume value and a second volume value (using any volume computation scheme based on discrete geometrical representation), and comparing the first volume value to the second volume value. The first volume value represents volume of the discrete geometrical representation of the third data piece. The second volume value represents volume of the discrete geometrical representation of the fourth data piece. This provides a fast identity test. When the pair of 3D shapes involved in the test have structurally compatible editable feature trees, said speed is achieved at relatively little robustness cost.

Alternatively or additionally, in the second option of the second examples, the data pieces of at least one (e.g. each) group may be two-by-two structurally compatible. For example, the step of editable feature tree edition may ensure that (i.e. restricted such that) each output data piece is structurally compatible to the input data piece. The structural compatibility between editable feature trees may form an equivalence relation. This improves efficiency, particularly when said second option of the second examples includes the test of the first option of the second examples.

In options of the third examples, a first editable feature tree and a second editable feature tree may be considered "structurally compatible" when the two following (e.g. necessary and/or sufficient) conditions are met:

Condition 1. The first editable feature tree has a respective (first) tree arrangement of geometrical operations at least partially matching the (second) tree arrangement of geometrical operations of the second editable feature tree. In other words, at least a part of the first tree arrangement matches (i.e. is equal/identical to) at least a part of the second tree arrangement. In examples, the first tree arrangement may match (i.e. be equal/identical to) the second tree arrangement, or the first (or respectively second) tree arrangement may be included in (i.e. match a part of) the second (or respectively first) tree arrangement. In addition, each pair of corresponding geometrical operations are the same. Condition 1 may further optionally provide that the first and second tree arrangements match exactly one another except for one or both of them having one or more additional single-leaved branches (i.e. branch having only one leaf node) relative to the other. In other words, the first and second tree arrangements may differ one from another only in that the first tree arrangement may have additional leaf geometrical shape(s) relative the second tree arrangement and/or in that the second tree arrangement may have additional leaf geometrical shape(s relative the first tree arrangement.

Condition 2. Each pair of corresponding leaf geometrical shapes have a same respective primitive shape type, and for each non-dimensional parameter (each parameter other than a dimensional parameter), each pair of corresponding leaf geometrical shapes have a same respective parameter value. In other words, each pair of corresponding leaf geometrical shapes is identical except for their dimensional parameter values.

By "corresponding" for a pair of elements, it is meant a first element of the first editable feature tree and a second element of the second editable feature tree which are located at matching locations of their respective editable feature trees (according to the tree arrangement matching provided by condition 1).

Editable feature trees meeting both these conditions potentially yield identical 3D shapes, since even if dimensional parameter values may be different the geometrical operations, primitive shape types, and other parameters may be such the resulting 3D shapes are the same. And in examples, the respective data pieces provided by the dataset-forming method may effectively comprise one or more sets of respective data pieces, where the respective editable feature trees of each set are all structurally compatible. In examples, one or more sets may each comprise at least two data pieces respective to editable feature trees that represent different (i.e. non-identical) 3D shapes. But alternatively or additionally, the set may comprise at least two data pieces respective to editable feature trees which have at least one different dimensional parameter (for the primitive shape type of at least one leaf geometrical shape and yet represent identical 3D shapes). The dataset-forming method may insert a single one of the two data pieces. The determining of said single data piece may be performed in any manner.

The second examples are now further discussed.

In examples, the dataset-forming method may comprise providing initial data comprising the discrete set of primitive shape types and, with each primitive shape type, the respective discrete set of one or more parameter domains. This means that the initial data comprise for each primitive shape type a respective data structure corresponding to an object class (referring to object-oriented programming) with fields corresponding to the parameters of the primitive shape type. In such cases, synthetizing the respective data pieces may be performed based on the initial data. For example, the providing of at least one respective data piece may include synthetizing the editable feature tree based on the initial data. The synthetizing may include generating a tree arrangement of operations, and for each leaf node of the tree arrangement, generating, based on the initial data, a leaf geometrical shape. In particular, the generating of a leaf geometrical shape may comprise selecting a primitive shape type, and selecting a parameter value for each parameter of the primitive shape type. This corresponds to creating an instance of a given class.

In case the methods are not limited to trees involving a single type of geometrical operation, the initial data may further comprise a set of geometrical operations. In such a case, generating a tree arrangement of operations may comprise generating a tree arrangement, and for each non-leaf node, selecting a geometrical operation. The set of geometrical operations may be discrete, for example comprising one or more Boolean operations including addition/union, subtraction, and/or intersection. This applies notably for generating CSG trees.

Generating a tree arrangement may comprise generating nodes and a tree structure connecting the nodes. As earlier-discussed, the tree arrangement may be restricted to single-rooted trees, binary trees, and/or full binary trees. In particular, one or more editable feature trees may be generated within trees of the type both single-rooted and fully binary, and where each non-leaf node has at least one leaf node as a child. In such a case, generating the tree arrangement may comprise selecting a depth of the tree arrangement, i.e. a number of non-leaf nodes. This information is sufficient to fully define a tree of said type.

Any selection performed when synthetizing an editable feature tree may be performed via a (e.g. random) sampling. This allows generating data representing relatively well the diversity of real situations. This thus leads to an eventually accurate learning.

Any (e.g. random) sampling may comprise a uniform (e.g. random) sampling within the set where the variable to be selected takes values (e.g. a random uniform sampling being a random sampling according to a uniform probability distribution).

For example:

The depth may be sampled according to a uniform distribution on a set of all integers higher than N1 and lower than N2, where N1 is a 'minimal depth' integer, higher than 0 and/or lower than 5, for example equal to 1, and N2 is a 'maximum depth' integer higher than N1 and/or lower than 100, 50, or 20, for example equal to 7.

The primitive shape type may be sampled according to a uniform distribution on the discrete set of primitive shape types.

Each Boolean operation may be sampled according to a uniform distribution on the discrete set of Boolean operations (for examples consisting of addition union, subtraction, and intersection).

The parameter values for each selected primitive shape type may be sampled according to a uniform distribution in a hyperrectangle (cartesian product of intervals which each form a parameter domain specific to a respective parameter of the primitive shape type). To simplify, the dataset-forming method may uniformly sample all the parameters of each primitive above in a hypercube $[a,b]^l$ where l is the number of parameters of the primitive and a and be are real numbers, a may be higher than or equal to 0 and/or lower than or equal to 1, for example equal to 0.2. b may be higher than or equal to 1 and/or lower than or equal to 10, for example equal to 2.

The specific examples of the second option of the second examples are now further discussed.

When for each of one or more primitive shape types, the one or more respective continuous parameters comprise one or more dimensional parameters, the synthetizing may in example comprise a mix between generating one or more initial data pieces each from the initial data (as described above), and deriving, based on each such generated initial data piece, one or more respective other (ulterior) data pieces based on a modification of said generated data piece. In examples, the synthetizing may comprise an initial generation of at least one (e.g. several) initial data piece based on the initial data. The initial generation includes, for each dimensional parameter (of each leaf geometrical shape), the earlier-described selection of an initial parameter value (e.g. via a sampling, optionally a random sampling). In such examples, the synthetizing may then comprise (e.g. for one or more—e.g. each—generated initial data piece), determining one or more ulterior data pieces by iteratively, starting from the initial data piece, modifying one or more parameter values each of a respective dimensional parameter and/or deleting one or more leaf geometrical shapes.

In particular, starting from the initial data piece, the iterative process may comprise reducing (e.g. as much as possible) one or more (e.g. as many as possible) dimensional parameter values and/or deleting one or more (e.g. as many as possible) leaf geometrical shapes, while keeping the represented 3D shape identical. In other words, the iterative process may aim at replacing the initial data piece by a more canonical data piece representing the same 3D shape, for example by the most canonical data piece obtainable by reducing dimensional parameter value(s) and/or deleting leaf geometrical shape(s) and that stills represents the same 3D shape as the initial data piece.

In examples, the iterative processing may comprise, starting from an initial data piece, a reduction algorithm which includes:

a. initializing:
   a third data piece (i.e. variable), and
   a fourth data piece (i.e. variable);
b. setting the value of the fourth data piece with the initial data piece;
c. marking as "non-visited":
   all leaf geometrical shapes of the editable feature tree of the fourth data piece, and
   all dimensional parameters of all leaf geometrical shapes of the editable feature tree of the fourth data piece;
d. selecting a non-visited leaf and marking the selected leaf as visited (otherwise if no non-visited leaf is available, jumping to step k);
e. selecting a non-visited dimensional parameter of the selected leaf and marking the selected dimensional parameter as visited (otherwise if no non-visited dimensional parameter is available, going back to step d);
f. initializing a parameter reduction value higher than 0 and inferior to the parameter value of the selected dimensional parameter (e.g. half the parameter value of the selected dimensional parameter, which corresponds to a bisection algorithm);
g. setting the value of the third data piece as the result of subtracting the parameter reduction value from the parameter value of the selected dimensional parameter;
h. testing an identity between the 3D shape of the third data piece and the 3D shape of the fourth data piece (e.g. via a simple volume comparison between the discrete geometrical representations of the third and fourth data pieces, since their editable trees are structurally compatible);
i. if the testing yields a positive result:
   a replacing the value of the fourth data piece by the value of the third data piece (the fourth data piece is identified as a second data piece and its value may thus be deleted);
   going back to step f;
j. else (i.e. if the testing yields a negative result):
   reducing the parameter reduction value (e.g. by its half, which corresponds to a bisection algorithm);
   if the parameter reduction value is higher than a predetermined threshold (e.g. 0.1 or 0.05), going back to step g, else going back to step e;
k. marking as "non-visited" all leaf geometrical shapes of the editable feature tree of the fourth data piece;
l. selecting a non-visited leaf and marking the selected leaf as visited (otherwise if no non-visited leaf is available, ending the algorithm);
m. setting the value of the third data piece as the result of deleting the selected leaf from the fourth data piece;
n. testing an identity between the 3D shape of the third data piece and the 3D shape of the fourth data piece (e.g. via a simple volume comparison between the discrete geometrical representations of the third and fourth data pieces, since their editable trees are structurally compatible);

o. if the testing yields a positive result:
   replacing the value of the fourth data piece by the value of the third data piece (the fourth data piece is identified as a second data piece and its value may thus be deleted);
   going back to step l.

This reduction algorithm comprises a first "for" loop over the leaves for reducing as many as possible geometrical shape leaves, with a second "for" loop over the dimensional parameters embedded in the first "for" loop for reducing each dimensional parameter as much as possible, and then a third "for" loop over the leaves for deleting as many as possible geometrical shape leaves.

The reduction of each primitive may be carried out dimensional-parameter-by-dimension-parameter, e.g. according to the X, Y or Z axes. The order of the dimensions to be considered may arbitrarily set. At least one parameter may be impacted by the reduction in one dimension. For example, if it is a cube that the synthetizing is trying to reduce, there will only be one impact parameter per dimension if the three dimensions of the cube (length, width, depth) are aligned on X, Y, Z. Conversely, in more complex cases, such as the reduction of a right isosceles trapezoidal prism oriented along the axes (X, Y), several parameters can impact in parallel.

Examples of the learning method are now discussed.

The neural network may in examples comprise recurrent neural network (RNN) cells (i.e. cells of a same RNN). Such examples allow learning an accurate neural network and thereby perform accurate inferences, the neural network presenting a sequential architecture (via the RNN) corresponding to the sequential character of the editable feature trees to be inferred.

In particular each RNN cell outputs at a respective time step, respective first data for inference of a respective primitive shape type and respective second data for inference of a respective parameter value for each of the respective discrete set of one or more parameter domains. The outputted data thus allow inference of a respective leaf geometrical shape. The geometrical operations may be inferred in any manner, for example predetermined (e.g. the inferred editable feature trees may be restricted to additive trees, such that each geometrical operation is an addition). Alternatively, each RNN cell may further output at a respective time step, respective data for inference of a respective geometrical operation (e.g. among a predetermined set of geometrical operations, e.g. including or consisting of addition/union, subtraction and/or intersection). The number of time steps may be predetermined. Alternatively, each RNN cell may further output respective data for inference of an end-or-continuation-decision (i.e. end token) for the editable feature tree.

Particularly efficient examples of the RNN outputs are now discussed.

The respective first data may comprise a respective discrete distribution of probabilities each attributed to a respective one of the discrete set of primitive shape types. In other words, each RNN cell outputs a distribution of probabilities over the primitive shape types, such that a probable primitive shape type may be inferred for a leaf geometrical shape corresponding to the respective time step.

Alternatively or additionally, the respective second data comprise (for each primitive shape type) a respective parameter value for each of the respective discrete set of one or more parameter domains. In other words, the RNN cells directly output the parameter values for the inferred primitive shape types. This simplifies the learning and improves convergence and accuracy, in particular since the parameters are continuous and it is difficult to learn a neural network outputting a density distribution.

In addition, the optional respective data for inference of a respective geometrical operation may comprise a respective (e.g. discrete) distribution of probabilities each attributed to a respective one of a predetermined (e.g. discrete) set of geometrical operations. Furthermore, the respective data for inference of the end token may comprise a probability of an end and/or a probability of a continuation (e.g. a Bernoulli distribution), as classical with RNNs.

Architectures of the neural network leading to particularly accurate results are now discussed.

In options, the neural network may comprise an initial encoder taking as input the discrete geometrical representation or a representation thereof. The encoder may in examples be a point cloud encoder (e.g. a PointNet encoder) and directly take as input a point cloud (forming the discrete geometrical representation or representing and/or extracted from the discrete geometrical representation). The encoder may in other examples be a 2D convolutional neural network (CNN) and take as input 2D image data (representing and/or extracted from the discrete geometrical representation). The 2D image data may be a single-channel rendering (i.e. a single view image) or a multi-channel rendering (i.e. a multi-view image) of the discrete geometrical representation. In efficient examples, the multi-channel rendering may be a four-view rendering based on four point of view (e.g. regularly) distributed around the discrete geometrical representation, for example substantially forming a square around discrete geometrical representation.

In alternative or additional options, each RNN cell may take as an (additional) input a result of a current predicted sequence (feedback loop). This improves accuracy. The feedback loop is possible, because thanks to the continuous parameters involved, the entry of the feedback loop is differentiable. In such options, the neural network may comprise a predetermined geometric modeler (i.e. static, that is, not learnt, in other words not comprising any modifiable weights), applied to the result of each RNN cell for computing a current predicted sequence. The modeler may be any data structure providing a mapping between an editable feature tree and a representation thereof (for example a multi-channel rendering). The geometric modeler may comprise a scheme for playing the editable feature tree and then extracting a representation of the resulting 3D shape.

In examples of such options, each RNN cell may include a respective encoder. The respective encoder may be applied to the input of the RNN, for example to compute a global feature representing the input. Depending on the output of the geometrical modeler, each respective encoder may in examples be a point cloud encoder (e.g. a PointNet encoder) if the geometric modeler outputs a point cloud. Each respective may in other examples be a 2D CNN if the geometric modeler outputs 2D image data. The 2D image data may be a single-channel rendering (i.e. a single view image) or a multi-channel rendering (i.e. a multi-view image), such as in the earlier-presented example.

In such examples, each respective encoder may be the same at each time step. Alternatively or additionally, one or more (e.g. all) of the respective encoders may optionally be the same as the initial encoder. This improves robustness of the process.

An example of a loss for a supervised training which leads to an accurate result penalizes, for the time step respective to each leaf geometrical shape of each discrete geometrical representation (each discrete geometrical representation being here associated to a respective ground truth editable feature tree), one or both of the following quantities:

a lowness of the probability of the respective first data attributed to the respective primitive shape type of the corresponding ground truth leaf geometrical shape, and/or a disparity between the one or more respective parameter values of the corresponding ground truth leaf geometrical shape and the one or more respective parameter values of the respective second data.

In other words, the supervised training may, by minimizing such a loss, act on the weights of the neural network so as to tend to make the respective probabilities outputted by each RNN cell close to 1 (i.e. not low) for the corresponding ground truth primitive shape type and close to 0 (i.e. low) for the other primitive shape types, and/or to make the respective continuous parameter values outputted by each cell close to their ground truth values. Such a loss handles accurately the discrete/continuous mixture of the problem.

In options of this example, the loss may further similarly penalize, for the time step respective to each leaf geometrical shape of each discrete geometrical representation, one or both of the additional quantities:

a lowness of the respective probability (outputted by an RNN cell) attributed to the corresponding ground truth geometrical operation, and/or a lowness of the probability (outputted by an RNN cell) to reach the tree arrangement (e.g. depth or length) of the corresponding ground truth editable feature tree based on the respective data for inference of the end token.

An example of an unsupervised training which leads to an accurate result is now discussed, where the respective first data comprise a respective discrete distribution of probabilities each attributed to a respective one of the discrete set of primitive shape types.

As known, an unsupervised training minimizes a loss. The minimizing includes exploring candidate respective discrete distributions of probabilities. In other words, the minimizing iteratively modifies neural network weights to explore outputted respective discrete distributions of probabilities and make them consistent with an unlabeled dataset (where each discrete geometrical representation is not associated to any ground truth editable feature tree). In a sense, the exploration of the candidate respective discrete distributions of probabilities is indirect, and a consequence of the direct exploration of the weights. In options, the minimizing further includes exploring candidate respective discrete distributions of probabilities over the geometrical operations and/or candidate respective discrete distributions of probabilities for the end token. In examples, the minimizing further includes exploring candidate respective parameter values for each of the respective discrete set of one or more parameter domains.

Now, the loss penalizes, for each discrete geometrical representation of the dataset and for each candidate, a disparity with a corresponding discrete geometrical representation. The corresponding discrete geometrical representation is derived from a respective editable feature tree, itself inferable based on the explored candidate respective discrete distribution of probabilities. In other words, given weight values of the neural network (at any iteration of the unsupervised training), the neural network may be inputted with a discrete geometrical representation of the unlabeled dataset to perform inference of editable feature trees. Each inferred editable feature tree may itself be based upon to derive in a discrete geometrical representation (by playing the tree and determining a discrete geometrical representation of the result). Such a derived discrete geometrical representation may be compared to the initial corresponding dataset's discrete geometrical representation.

In examples, the unsupervised training may comprise a sampling step for at least one (e.g. each) discrete geometrical representation. The training may comprise providing mini-batches and the sampling may comprise, for each mini-batch, sampling an editable feature tree per discrete geometrical representation of the mini-batch by following the data outputted by the neural network (including the probability distribution(s) and the continuous parameter value(s) outputted by the RNN). The sampling may then calculate the loss, which compares (i.e. penalizes disparity between) the input discrete geometrical representation (or its representation, e.g. rendering) and the discrete geometrical representation corresponding to the sampled editable feature tree. This loss is not differentiable relative to the sampling since the sampling is stochastic and discrete. Thus, a classical backpropagation of the true gradient relative to the variables cannot be performed, since there is no such true gradient.

The proposed example of unsupervised training proposes to use a reinforcement approach to provide a pseudo-gradient of the loss relative to a variable representing the candidate respective discrete distributions of the respective first data, and optionally a pseudo-gradient of the loss relative to a variable representing the candidate respective discrete distributions over the geometrical operations and/or a pseudo-gradient of the loss relative to a variable representing the end token distribution. The minimizing may then include a backpropagation (e.g. stochastic descent) of such pseudo-gradient(s) of the loss to learn the neural network. Since the pseudo-gradients are provided by a reinforcement algorithm, the learning is accurate even if the backpropagation is not the one of a true gradient. The minimizing may also include a backpropagation of the (true) gradient of the loss relative to the respective parameter values for each of the respective discrete set of one or more parameter domains (since the loss is differentiable relative to these variables). The reinforcement approach thus solves the differentiability issue raised by the introduction of discrete probability distributions, and only this issue.

An example machine-learning process including the examples of the methods is now discussed.

Recurrent Neural Networks

The example machine-learning process is based on recurrent neural networks (RNN). A recurrent neural network is a deep neural network with an internal memory state. Recurrent neural networks can thus exhibit a temporal behavior, unlike feedforward neural networks. They implicitly take into account the past entries to predict the next outcome. They can be written as $y_t=f_2^1(x_t,h_t)$, $h_{t+1}=f_w^2(x_t,h_t)$, where y is the output, x is the input, and h is the internal hidden state, also called memory, w are the weights of the RNN. The memory h is not a hard memory stacking all the past inputs, it is a fixed sized vector, that is learned through $f_w^2$, such that the RNN learns to keep only useful information from the past steps.

Aim of the Example Machine-Learning Process

Starting from a raw mesh the example machine-learning process allows building, without any supervision, a CSG Tree, consisting of a sequence of primitives which are sequentially merged with Boolean operations. This example machine-learning process may be especially useful in order to convert raw meshes into a CAD format. This CSG digitization may allow conversion of a raw surface into an editable 3D model that can then be used to deform the model, connect it to a mechanical assembly, or simulate it. These raw meshes can come from a laser scan of a real 3D mechanical part, or from a B-rep model obtained on a 3D marketplace.

Principle of the Example Machine-Learning Process

The example machine-learning process allows learning a recurrent neural network which predicts a CSG tree from a raw mesh. Firstly, a synthetic dataset of CSG trees is randomly generated. Each CSG tree in the dataset is reduced to its minimal expression, in order to remove any redundancy. This dataset is used to train in a supervised way a recurrent neural network to predict a CSG tree from a raw mesh. The network is then refined in an unsupervised way by reinforcement learning on a real dataset of raw meshes, whose CSG trees are unknown. Finally, the network is used to infer plausible CSG trees from a new raw mesh. An optimization scheme is used to refine the continuous parameters of the tree in order to fit at best the CSG tree to the input mesh.

Also, any CSG tree in the example machine-learning process is a single-rooted and full binary tree (of the type where each non-leaf node has at least one leaf node as a child).

Effects of the Example Machine-Learning Process

The example machine-learning process is much more robust to noise and incomplete data in the input meshes than other deterministic methods based on curvatures analysis. The example machine-learning process provides an improvement over paper [10], for several reasons. First, paper [10] only works with discretized primitives, whereas the example machine-learning process deals with continuous primitives (parametric solids). Second, the example machine-learning process provides a robust final optimization to continuously refine the CSG tree. Third, the RNN of the example machine-learning process includes a feedback loop which eases the inference process. Fourth, the pre-training step of the example machine-learning process is sounder, as it is applied on a CSG dataset where all CSG trees have been reduced to avoid redundancy according to a new algorithm.

Description of the Example Machine-Learning Process

1. Generate the Synthetic CSG Dataset

Figure 3:
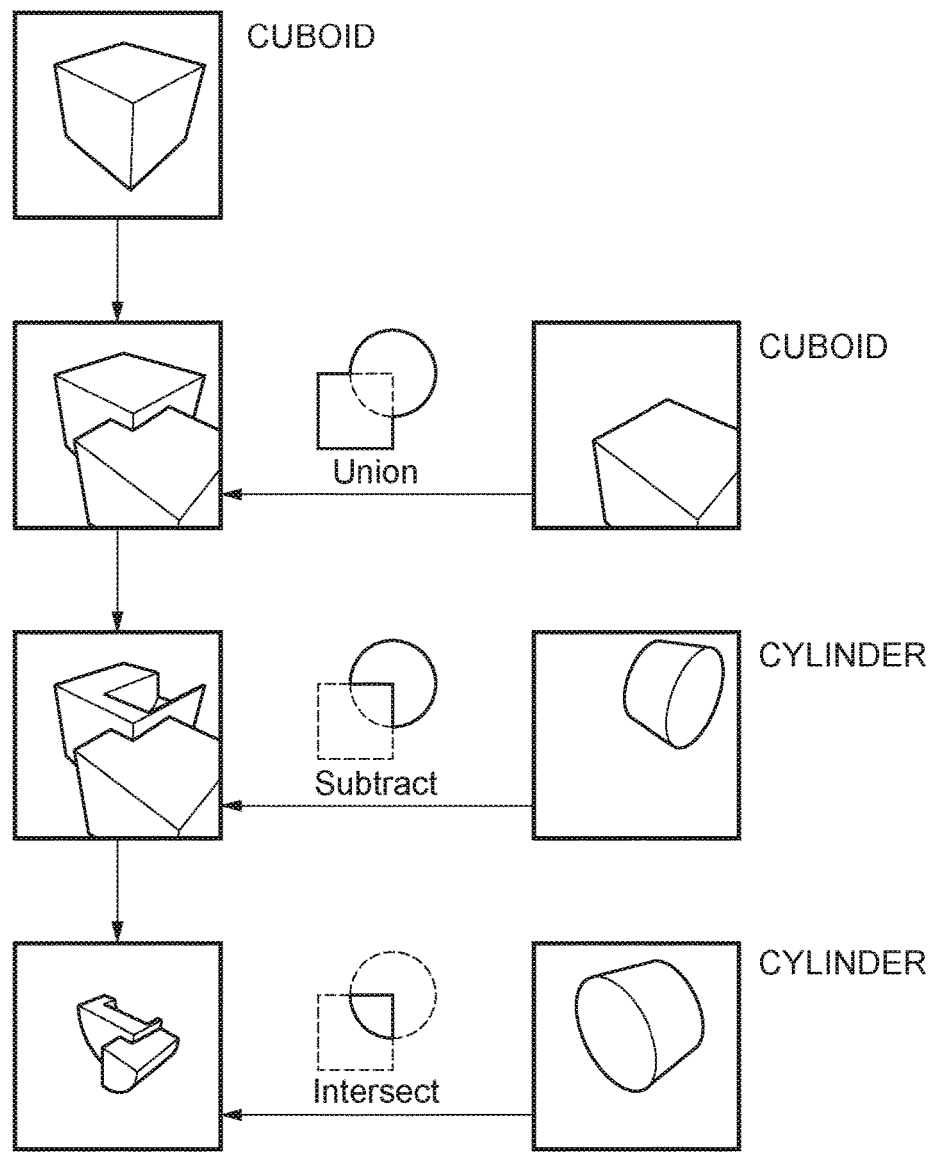
FIGS. 3, 4, 5, 6, 7, 8, 9, 10 and 11 illustrate the methods.

In the first step, the example machine-learning process generates a synthetic dataset of CSG trees. The trees are sequences of primitives interleaved with a Boolean operation between each primitive. Each Boolean operation is a binary operator which applies onto the following primitive and the result of the previous operation. The three usual Boolean operations are addition/subtraction/intersection. Thus, each primitive in the sequence is (added/intersected/subtracted) to the current result of the sequence, as illustrated in FIG. 3.

Primitives belong to a set of base types (labeled as $\{1, \ldots, L\}$, such as cuboids, cylinders, prisms, etc. Each primitive type has its own set of continuous parameters (for instance, the size and position of a cuboid).

To sample a CSG tree, the example machine-learning process randomly samples its depth, primitive types, and Boolean operations. For each primitive, the example machine-learning process also samples its continuous parameters. The example machine-learning process thus gets a random CSG tree. This CSG can be turned into a raw mesh by applying its Boolean operations sequentially to its sequence of primitives.

Figure 4:
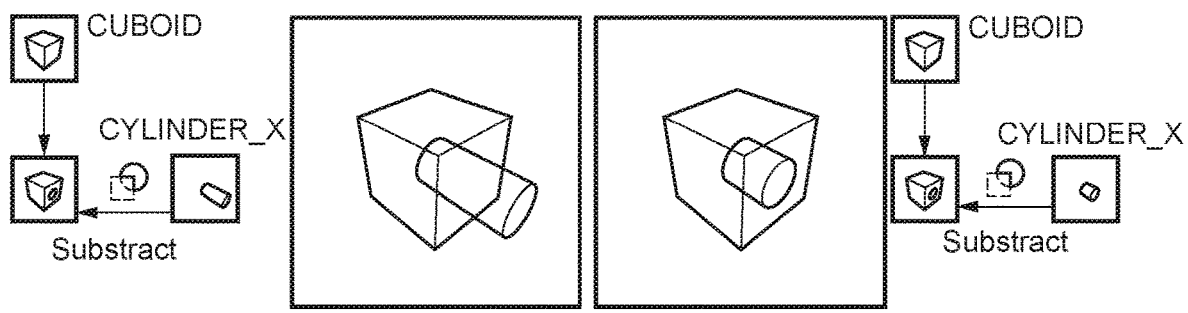

The example machine-learning process finally gets a dataset of raw meshes with corresponding CSG trees. One of the major problems for the pre-training step, is that an infinite sequence of CSG trees can correspond to the exact same raw geometry. For instance, there are endless ways to intersect two cubes that lead to the same resulting cube. FIG. 4 shows an example.

It is much harder to train a network which maps the same raw input mesh to different CSG trees. To alleviate this issue, the example machine-learning process involves an algorithm to reduce each sampled CSG tree to its minimal expression, in order to enforce a bijection between the CSG trees and their resulting meshes.

Firstly, the example machine-learning process uses a bisection algorithm in order to reduce the dimension of each primitive along all its axes, while constraining the result 3D shape to remain the same. In order to get a fast test to check if the result remains unchanged, the example machine-learning process compares the volume of the result 3D shapes. The example machine-learning process keeps reducing each primitive while the volume of the resulting CSG remains the same.

Secondly, the example machine-learning process removes any primitive and its following operation in the tree if it does not change the result.

Figure 5:
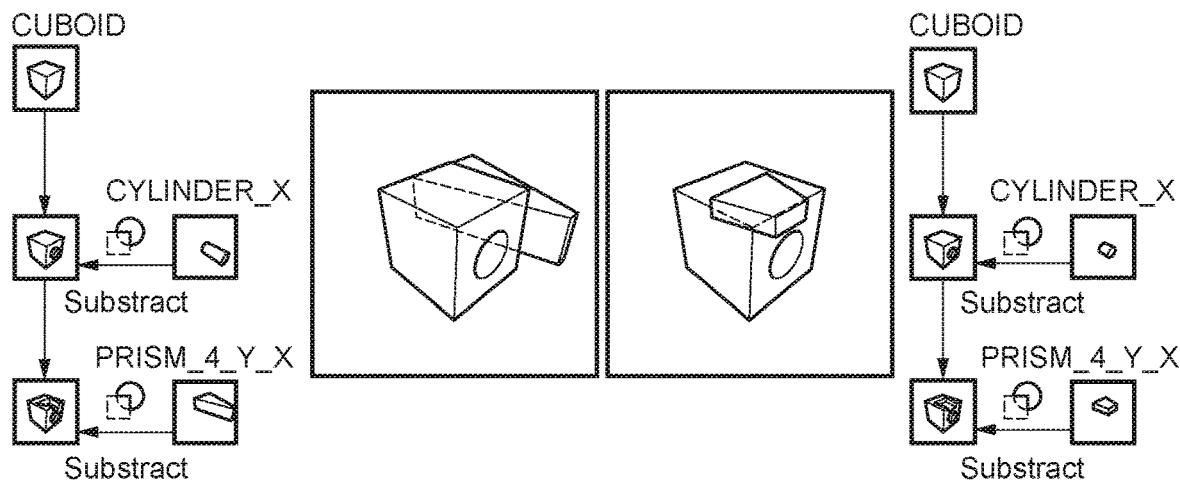
Figure 6:
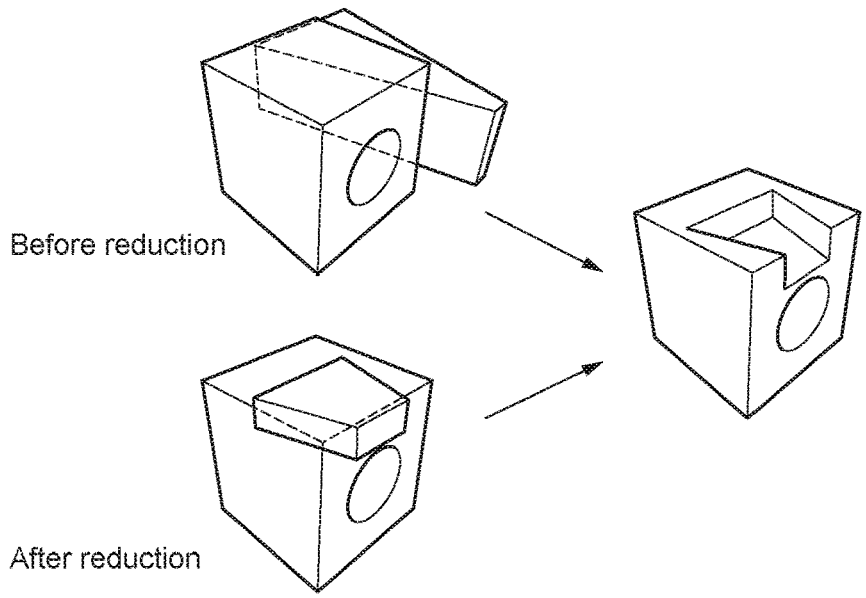

This reduction algorithm is illustrated by FIGS. 5-6.

Finally, the example machine-learning process can also add noise (such as a Perlin noise, the kind of noise depending on the application) to the resulting meshes.

2. Supervised Learning the Recurrent Neural Network

The example machine-learning process defines a recurrent neural network (RNN) as the following. The RNN takes as input a discrete representation I of the 3D mesh to digitize, for instance a multi-channel image I, where each channel represents a rendering view or depth view of the input mesh, a 3D voxel grid, a 3D point cloud, etc.

Figure 7:
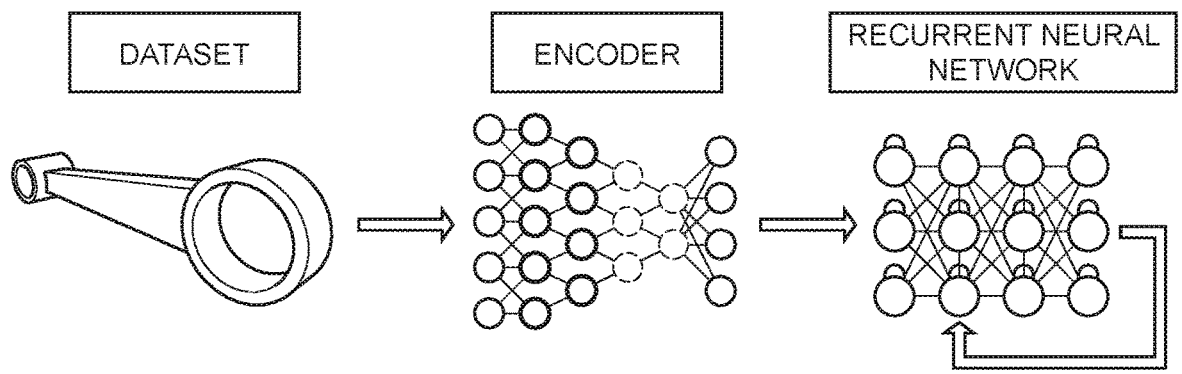

The RNN includes an encoder applied to its input to compute a global feature representing the input shape. This is illustrated by FIG. 7.

The encoder may for example be a 2D CNN if the input is an image, a PointNet encoder if it is a point cloud, such as described by the following paper:

Charles R Qi, Hao Su, Kaichun Mo, and Leonidas J Guibas. Pointnet: Deep learning on point sets for 3d classification and segmentation. In Computer Vision and Pattern Recognition, 201.7.

The CNN may be the same at each step of the CSG. Said CNN used at steps of the CSG may itself be the same or different from the initial CNN. In case it is the same, the process is more robust.

Each RNN cell can also take optionally as input the result of current predicted sequence (feedback loop).

The result of the current predicted sequence is computed with a geometric modeler. The modeler m can be seen as a mapping between a CSG sequence and its resulting representation (for example a multi-channel rendering).

Each RNN cell outputs at each time step t a discrete distribution p over the primitive types, a distribution o over the boolean operations, as well as a Bernoulli distribution q over the end token indicating whether the CSG is over: q is the probability that the current step t is not the last step of the current CSG sequence, and so 1−q is the probability that the current step is the last step in the sequence. $p_y$ is the probability of the primitive type y and $o_y$ is the probability of the operation y.

It also outputs the continuous parameters $g_l$ at each time step t for each primitive type l.

Figure 8:
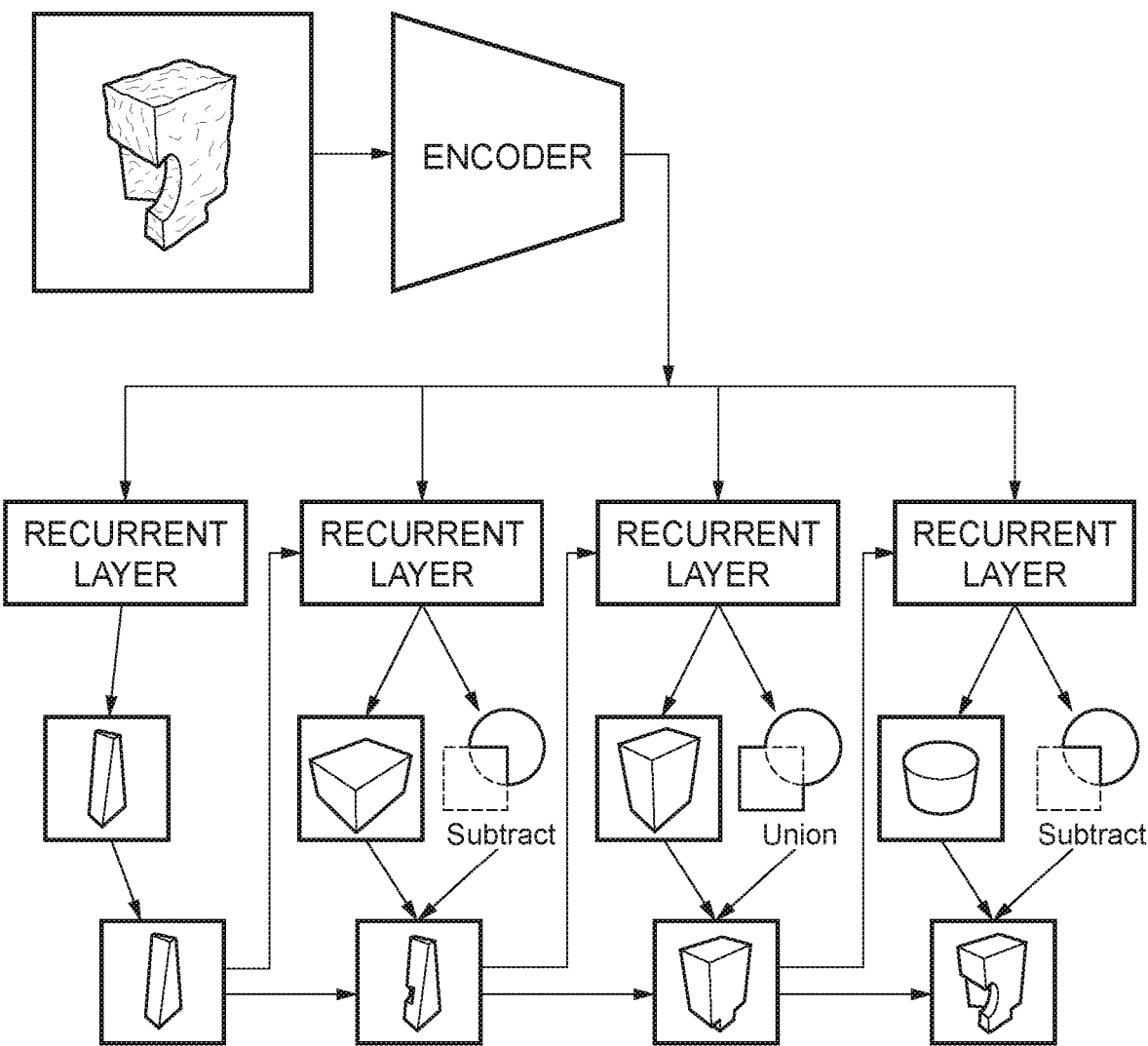

FIG. 8 shows an example of architecture of the neural network learnt by the example machine-learning process.

This RNN is pre-trained in a supervised manner, using the synthetic dataset. Notice that a real CSG dataset can also be used.

Let N be the size of the dataset, and $\hat{T}_n$ the depth of the n-th CSG sequence. Each CSG sequence is written as a sequence of primitive types ($\hat{a}_1^n, \ldots, \hat{a}_{\hat{T}_n}^n$) and a sequence of operations $\hat{b}_2^n, \ldots, \hat{b}_{\hat{T}_n}^n$. For each primitive $\hat{a}_t^n$, let $\hat{x}_t^n$ be its parameters. The input representation of the n-th CSG is denoted $I^n$.

We also denote by $\hat{I}_t^n$ the representation of the intermediate result of the known CSG tree n at time step t, i.e. $\hat{I}_t^n = m([\hat{a}_1^n, \ldots, \hat{a}_t^n], [\hat{x}_1^n, \ldots, \hat{x}_t^n], [\hat{b}_2^n, \ldots, \hat{b}_t^n])$ (and $\hat{I}_0^n = 0$).

The hat over a letter indicates a ground truth label of the CSG sequence.

General equation of our RNN:

$$\begin{pmatrix} p \\ o \\ q \\ g \end{pmatrix}_t = f_w^1(I, I_{t-1}, h_t), h_t = f_w^2(I, I_{t-1}, h_{t-1}), h_0$$

=0, with w the weights of the neural network. We recall that the feedback loop (the input $I_{t-1}$ of the RNN) is optional.

The loss that the example machine-learning process minimizes to train the weights of the network (using standard deep learning techniques, such as ADAM solver over mini-batches) may the following:

$$L_1(w) = L_{primitives}(w) + L_{operations}(w) + L_{length}(w) + \lambda L_{parameters}(w)$$

$$L_{primitives}(w) = -\sum_{n=1}^{N} \frac{1}{\hat{T}_n} \sum_{t=1}^{\hat{T}_n} \log\left[p_{\hat{a}_t^n}(I^n, \hat{I}_{t-1}^n, h_t^n)\right]$$

$$L_{operations}(w) = \sum_{n=1}^{N} \frac{1}{\hat{T}_n - 1} \sum_{t=2}^{\hat{T}_n} \log\left[o_{\hat{b}_t^n}(I^n, \hat{I}_{t-1}^n, h_t^n)\right]$$

$$L_{length}(w) =$$

$$-\sum_{n=1}^{N} \left[ \frac{1}{\hat{T}_n} \log\left[1 - q\left(I^i, \hat{I}_{\hat{T}_n-1}^n, h_{\hat{T}_n}^n\right)\right] + \frac{1}{\hat{T}_n} \sum_{t=1}^{\hat{T}_n-1} \log[q(I^n, \hat{I}_{t-1}^n, h_t^n)] \right]$$

$$L_{parameters}(w) = \sum_{n=1}^{N} \frac{1}{\hat{T}_n} \sum_{t=1}^{\hat{T}_n} \left\| \hat{x}_t^n - g_{\hat{a}_t^n}(I^n, \hat{I}_{t-1}^n, h_t^n) \right\|_2^2$$

$\lambda$ is a tradeoff parameter between the classification loss over discrete variables $L_{primitives}(w) + L_{operations}(w) + L_{length}(w)$ and the continuous regression loss $L_{parameters}(w)$. It can for example be initialized as $$\lambda = \frac{L_{primitives}(w_0) + L_{operations}(w_0) + L_{length}(w_0)}{L_{parameters}(w_0)}$$

where $w_0$ are the randomly initialized weights of the neural network.

Any lowness penalization function other than a log (cross-entropy term) may be used for any of the terms $L_{primitives}(w)$, $L_{operations}(w)$, and $L_{length}(w)$, and/or any distance d other than the L2 distance and/or any increasing and/or positive function incr other than the square function may be used for $L_{parameters}(w)$.

In the case where the feedback loop is used, when the RNN is used at inference to predict a CSG from an input 3D representation, the example machine-learning process may have no access to the ground truth intermediate representations $\hat{I}_t$. During inference, $\hat{I}_t$ may be replaced with its inferred version by the RNN:

$$I_t = m([a_1, \ldots, a_t], [x_1, \ldots, x_t], [b_2, \ldots, b_t]),$$

where $a_i$ and $b_i$ are sampled from $p_t$ and $o_t$, and $x_i = g_t^{a_i}(I, I_{t-1}, h_t)$.

In the case where the example machine-learning process uses the feedback loop, once the RNN is learnt by minimizing the loss $L_1(w)$, the example machine-learning process may minimize the following loss $\tilde{L}_1(w)$ in order to train the RNN to use its own predicted intermediate representations $I_t$ for its feedback loop.

$\tilde{L}_1(w)$ is the exact same loss as $L_1(w)$, except that the example machine-learning process replaces all the ground truth intermediate representations $$\hat{I}_t^n = m([\hat{a}_1^n, \ldots, \hat{a}_t^n], [\hat{x}_1^n, \ldots, \hat{x}_t^n], [\hat{b}_2^n, \ldots, \hat{b}_t^n])$$

by:

$$\tilde{I}_t^n = m([\hat{a}_1^n, \ldots, \hat{a}_t^n], [\tilde{x}_1^n, \ldots, \tilde{x}_t^n], [\hat{b}_2^n, \ldots, \hat{b}_t^n]),$$

where $\tilde{x}_t^n = g_{\hat{a}_t^n}(I^n, \tilde{I}_{t-1}^n, h_t^n)$ are the inferred parameters by the RNN.

That means that the example machine-learning process uses the inferred continuous parameters predicted by the RNN to compute the intermediate representations (but keeps the ground truth structure of the CSG tree).

Now, $\tilde{I}_t^n$ is no more a ground truth fixed representation, and depends on the weights of the neural network (via $g_1, \ldots, g_t$ which depend on the weights). Thus, to minimize $\tilde{L}_1(w)$, the example machine-learning process may be enabled to differentiate $\tilde{I}_t^n$ with respect to $x_1, \ldots, x_t$, that is to differentiate the geometric modeler m. The differential of the mapping in may be computed with finite differences. Moreover, a smoothing kernel can also be applied to smooth the result.

3. Unsupervised Learning of the Recurrent Neural Network

The RNN has been pre-trained on a synthetic dataset, which is not representative of real datasets. Thus, the example machine-learning process may fine-tune it on a real dataset. However, real datasets often do not come associated with their CSG trees. That is the example machine-learning process proposes a reinforcement approach to fine-tune the network without supervision. Moreover, this approach allows the network to predict more consistent trees, whereas the pre-training step is forced to match the synthetic dataset which, despite the reduction algorithm, can present different CSG trees whose 3D shape is very similar.

The RNN can also be directly trained in an unsupervised way using the same technique as presented here for the fine-tuning step. In that case the example machine-learning process may directly start from a randomly initialized RNN. But the convergence is much slower than starting from a pre-trained network.

In this unsupervised learning step, the dataset only contains N raw meshes, without any label, CSG information, or such.

The loss may simply compare the renderings of the predicted CSG with the renderings of the input mesh. To compute the predicted CSG, the example machine-learning process may sample the RNN according to its distributions, conditioned by the input. The sampling may be performed according to the example of the inference method presented later in section 4 but based on the current weight values.

The example machine-learning process may start with $I_0''=0$ and sample $a_1''$ from $p(I'',I_0'',h_1'')$, $b_1''$ from $o(I'',I_0'',h_1'')$, and set $I_1''=m([a_1''],[x_1''],[b_2''])$, where $x_1''=g_{a_1''}(I'',I_0'',h_1'')$.

The example machine-learning process may also sample the end/continue token from $q(I'',I_0'',h_1'')$. If it samples the end token, it stops here. Otherwise, the example machine-learning process iterates this sampling process until the end token is sampled or the time step reaches a maximal allowed time step T be the maximal allowed time step (i.e. the maximal length of a CSG sequence): the example machine-learning process samples:

$a_t''$ from $p(I'',I_{t-1}'',h_t'')$,
$b_t''$ from $o(I'',I_{t-1}'',h_t'')$, and
set $I_t''=m([a_1'', \ldots ,a_t''],[x_1'', \ldots ,x_t''], [b_2'', \ldots ,b_t''])$, where $x_t''=g_{a_t''}(I'',I_{t-1}'',h_t'')$.

We denote by $T_n$, the depth of the sampled CSG of the n-th input raw mesh.

With these notations, the loss can be easily written as $$L_2(w) = \sum_{n=1}^{N} d(I^n, I^n_{T_n})$$

where d is a similarity measure between $I''$ and $I_{t_n}''$. For example, if the example machine-learning process uses multi-channel images or 3D voxels grids as the representation of the 3D input, the example machine-learning process can use $L_2 = \sum_{n=1}^{N} \|I^n - I^n_{T_n}\|_2^2$.

If the example machine-learning process uses point clouds, the example machine-learning process can use a Chamfer distance.

This loss is differentiable with respect to the continuous parameters $x_1'', \ldots ,x_t''$. Thus, minimizing this loss only allows to learn (or fine-tune if the RNN has been pre-trained) the weights of the neural network related to those continuous parameters, but it cannot learn the discrete distributions p,o,q. Indeed, the discrete distributions (which are differentiable with respect to the weights of the network) are used to infer discrete variables (primitive types, Boolean operations, CSG length) and the loss cannot be differentiable with respect to discrete variables.

In order to fine tune also these distributions, the example machine-learning process may backpropagate a gradient of the loss with respect to these distributions. The example machine-learning process may use a reinforcement algorithm to get such gradients for the discrete distributions p,o,q. The reinforcement algorithm is limited to these discrete distributions, and thus the unsupervised learning may get true gradients for the other variables. This limits approximation and thereby effects on accuracy, and this allows to optimize distributions which would otherwise not be updated and thus not learnt.

The reinforcement algorithm may be the REINFORCE algorithm described in the following paper:

R. J. Williams. Simple statistical gradient-following algorithms for connectionist reinforcement learning. Machine Learning, 229-256, 1992

This provides the following gradient formulas:

$$\frac{\partial L_2}{\partial p^y} = \frac{L_2 - \beta}{p^y} 1_{t \leq T_i} 1_{y = a_t^i}$$

$$\frac{\partial L_2}{\partial o^y} = \frac{L_2 - \beta}{o^y} 1_{t \leq T_i} 1_{y = b_t^i}$$

$$\frac{\partial L_2}{\partial q} = -\frac{L_2 - \beta - \rho}{q} 1_{t = T_i}$$

where $\rho$ is an additional sparsity reward to encourage the CSG tree to have a maximal expressivity for a minimal size, and $\beta$ is a baseline used to reduce the variance of the estimated gradients.

Typically $\rho$ can be approximately equal to the $L_2$ loss computed over a supervised dataset used to pre-train the network.

Let $w_0$ be the weights before the unsupervised learning (either $w_0$ comes from a random initialization, or from a supervised pre-training step). Then, $\beta$ can be chosen as a constant, for example $\frac{1}{2}L_2(w_0)$ if the network has been pre-trained or $\frac{1}{10} L_2(w_0)$ if we start from random weights $w_0$. Or the example machine-learning process can also set $\beta$ as a moving mean of the $L_2$ losses during training.

Notice that in the unsupervised learning setting, the example machine-learning process may also be enabled to differentiate the mapping m for the same reason as in the previous section (supervised learning with feedback loop). The difference is that in the unsupervised setting, even if the example machine-learning process does not use a feedback loop, the example machine-learning process may differentiate the modeler as the loss explicitly depends on the final CSG representation $I_{T_n}''$.

4. Inference and Final Refinement

Once the network is trained, the example machine-learning process can use it to infer the most likely plausible CSG trees from a raw input mesh. To do so the example machine-learning process may apply a beam search algorithm, with a width k, as a greedy search would be prohibitive for deep CSG trees.

At the first step t=1, the example machine-learning process may sample the k most likely CSG sequences. Then, at each following step, for each current sequence the example machine-learning process may compute the k most likely operations and primitives. At each step this gives us $k^2$ CSG sequences, among which the example machine-learning process may only keep the k most likely. They are selected based on the probability of the new potential sequence, which is the probability of the current sequence multiplied by the probability of the primitive multiplied by the probability of the operation multiplied by the probability of the end token.

Finally, the example machine-learning process obtains k plausible CSG sequences. For each sequence, the example machine-learning process may refine the continuous parameters of all the primitives of the sequence, for example by minimizing the loss $L_2$ with a differentiable optimization (such as BFGS). At the end, either the example machine-learning process may only keep the CSG tree which minimizes this loss, or the example machine-learning process may propose all k CSG trees to the user.

Figure 9:
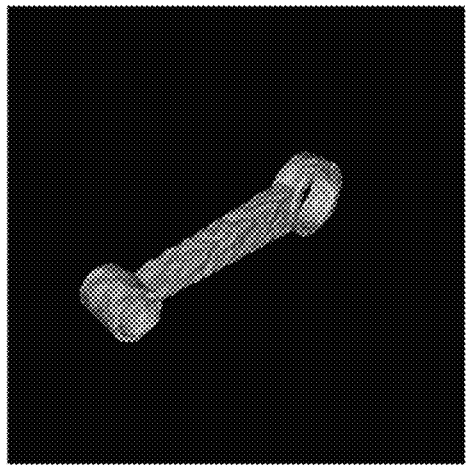
Figure 10:
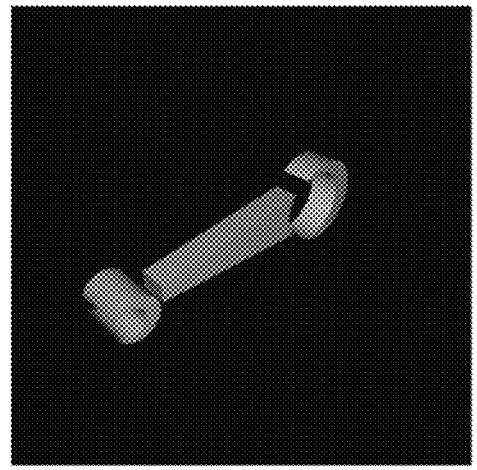
Figure 11:
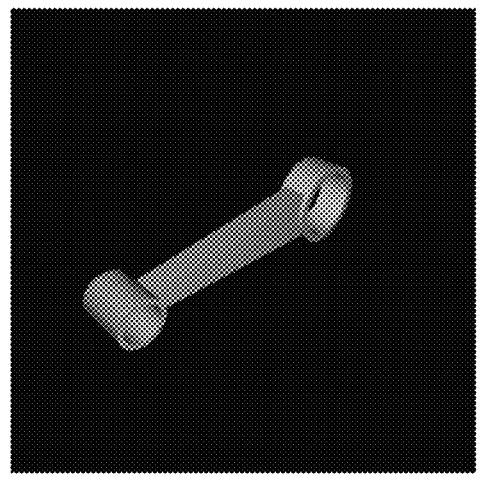

FIGS. 9-11 show a test of application of the inference method of the example machine-learning process, based on a neural network learnt in line with the example machine-learning process. FIG. 9 shows a raw input mesh representing a mechanical tool. FIG. 10 shows the result of applying the inference method before refinement (after applying the geometrical modeler to the inferred editable feature tree). FIG. 11 shows the result of after refinement.

The invention claimed is:

1. A computer-implemented method for forming a dataset configured for learning a neural network, the neural network being configured for inference, from a discrete geometrical representation of a 3D shape, of an editable feature tree representing the 3D shape, the editable feature tree comprising a tree arrangement of geometrical operations applied to leaf geometrical shapes, the method comprising:
obtaining respective data pieces each including:
an editable feature tree representing a 3D shape, the editable feature tree comprising a tree arrangement of geometrical operations applied to leaf geometrical shapes, and
a discrete geometrical representation of the 3D shape, the discrete geometrical representation corresponding to a result of applying the tree arrangement of geometrical operations to the leaf geometrical shapes; and
inserting a part of the data pieces in the dataset each as a respective training sample, the respective 3D shape of each of one or more first data pieces inserted in the dataset being identical to the respective 3D shape of respective one or more second data pieces not inserted in the dataset,
wherein for each first data piece, the editable feature tree of the first data piece is structurally compatible to the editable feature tree of each respective second data piece, and
wherein:
with respect to a discrete set of primitive shape types, and for each primitive shape type, a respective discrete set of one or more parameter domains each of a respective continuous parameter is obtained, each parameter domain having respective parameters values of the respective continuous parameter, each leaf geometric shape being formed by a respective primitive shape type, with a respective parameter value for each of the respective discrete set of one or more parameter domains,
for each of one or more primitive shape types, the one or more respective continuous parameters consist of one or more dimensional parameters and one or more other parameters, the one or more other parameters including one or more positioning parameters, and
a first editable feature tree and a second editable feature tree are structurally compatible when:
the tree arrangement of geometrical operations the first editable feature tree at least partially matches the tree arrangement of geometrical operations of the second editable feature tree, and each pair of corresponding leaf geometrical shapes have a same respective primitive shape type, and for each other parameter, a same respective parameter value.

2. The method of claim 1, wherein, the discrete set of primitive shape types comprises a cuboid type, a sphere type, one or more cylinder types, and/or one or more prism types.

3. The method of claim 1, wherein the obtaining of the respective data pieces includes:
obtaining initial data including the discrete set of primitive shape types and each respective discrete set of one or more parameter domains; and
synthetizing the respective data pieces based on the initial data.

4. The method of claim 3, wherein for each of one or more primitive shape types, the one or more respective continuous parameters include one or more dimensional parameters, and the synthetizing includes:
generating at least one initial data piece based on the initial data, including, for each dimensional parameter, selecting a respective parameter value; and then
determining at least one ulterior data piece based on the initial data piece, including iteratively, starting from the initial data piece, modifying one or more parameter values each of a respective dimensional parameter and/or deleting one or more leaf geometrical shapes.

5. The method of claim 1, wherein the inserting includes:
obtaining pairs of respective data pieces each including a third data piece and a fourth data piece; and
for each pair:
testing an identity between the 3D shape of the third data piece and the 3D shape of the fourth data piece; and
identifying one data piece among the third and fourth data pieces as a second data piece upon the testing yielding a positive result.

6. The method of claim 5, wherein the testing includes:
computing a first volume value, the first volume value representing a volume of the discrete geometrical representation of the third data piece;
computing a second volume value, the second volume value representing a volume of the discrete geometrical representation of the fourth data piece; and
comparing the first volume value to the second volume value.

7. The method of claim 1, wherein for each of one or more first data pieces, the inserting includes selecting the first data piece as a function of canonicity of the editable feature tree of the first data piece.

8. A computer-implemented method of applying a dataset formable according a computer-implemented process for forming a dataset configured for learning a neural network, the neural network being configured for inference, from a discrete geometrical representation of a 3D shape, of an editable feature tree representing the 3D shape, the editable feature tree comprising a tree arrangement of geometrical operations applied to leaf geometrical shapes, the method comprising:
obtaining respective data pieces each including:
an editable feature tree representing a 3D shape, the editable feature tree comprising a tree arrangement of geometrical operations applied to leaf geometrical shapes, and
a discrete geometrical representation of the 3D shape, the discrete geometrical representation corresponding to a result of applying the tree arrangement of geometrical operations to the leaf geometrical shapes;

inserting a part of the data pieces in the dataset each as a respective training sample, the respective 3D shape of each of one or more first data pieces inserted in the dataset being identical to the respective 3D shape of respective one or more second data pieces not inserted in the dataset; and learning a neural network based on the dataset, wherein for each first data piece, the editable feature tree of the first data piece is structurally compatible to the editable feature tree of each respective second data piece, and wherein:

with respect to a discrete set of primitive shape types, and for each primitive shape type, a respective discrete set of one or more parameter domains each of a respective continuous parameter is obtained, each parameter domain having respective parameters values of the respective continuous parameter, each leaf geometric shape being formed by a respective primitive shape type, with a respective parameter value for each of the respective discrete set of one or more parameter domains, for each of one or more primitive shape types, the one or more respective continuous parameters consist of one or more dimensional parameters and one or more other parameters, the one or more other parameters including one or more positioning parameters, and a first editable feature tree and a second editable feature tree are structurally compatible when:

the tree arrangement of geometrical operations the first editable feature tree at least partially matches the tree arrangement of geometrical operations of the second editable feature tree, and each pair of corresponding leaf geometrical shapes have a same respective primitive shape type, and for each other parameter, a same respective parameter value.

9. A device comprising a processor; and a non-transitory data storage medium having recorded thereon:

a dataset formable according a computer-implemented process for forming a dataset configured for learning a neural network, the neural network being configured for inference, from a discrete geometrical representation of a 3D shape, of an editable feature tree representing the 3D shape, the editable feature tree including a tree arrangement of geometrical operations applied to leaf geometrical shapes, and a computer program comprising instructions for forming the dataset configured for learning the neural network, the neural network being configured for inference, from the discrete geometrical representation of the 3D shape, of the editable feature tree representing the 3D shape, the editable feature tree including the tree arrangement of geometrical operations applied to leaf geometrical shapes, wherein the computer program, when executed by the processor, causes the processor to be configured to obtain respective data pieces each including:

an editable feature tree representing a 3D shape, the editable feature tree comprising a tree arrangement of geometrical operations applied to leaf geometrical shapes, and a discrete geometrical representation of the 3D shape, the discrete geometrical representation corresponding to a result of applying the tree arrangement of geometrical operations to the leaf geometrical shapes;

insert a part of the data pieces in the dataset each as a respective training sample, the respective 3D shape of each of one or more first data pieces inserted in the dataset being identical to the respective 3D shape of respective one or more second data pieces not inserted in the dataset; and/or wherein the computer program, when executed by the processor, causes the processor to be configured to learn a neural network based on the dataset, wherein for each first data piece, the editable feature tree of the first data piece is structurally compatible to the editable feature tree of each respective second data piece, wherein with respect to a discrete set of primitive shape types, and for each primitive shape type, a respective discrete set of one or more parameter domains each of a respective continuous parameter is obtained, each parameter domain having respective parameters values of the respective continuous parameter, each leaf geometric shape being formed by a respective primitive shape type, with a respective parameter value for each of the respective discrete set of one or more parameter domains, for each of one or more primitive shape types, the one or more respective continuous parameters consist of one or more dimensional parameters and one or more other parameters, the one or more other parameters including one or more positioning parameters, and a first editable feature tree and a second editable feature tree are structurally compatible when:

the tree arrangement of geometrical operations the first editable feature tree at least partially matches the tree arrangement of geometrical operations of the second editable feature tree, and each pair of corresponding leaf geometrical shapes have a same respective primitive shape type, and for each other parameter, a same respective parameter value.

10. The device of claim 9, wherein the discrete set of primitive shape types comprises a cuboid type, a sphere type, one or more cylinder types, and/or one or more prism types.

11. The device of claim 9, wherein the processor is further configured to obtain the respective data pieces by being configured to:

obtain initial data including the discrete set of primitive shape types and each respective discrete set of one or more parameter domains, and synthetize the respective data pieces based on the initial data.

12. The device of claim 11, wherein for each of one or more primitive shape types, the one or more respective continuous parameters include one or more dimensional parameters, and the processor is configured to synthetize by being configured to:

generate at least one initial data piece based on the initial data, including, for each dimensional parameter, selecting a respective parameter value, and then determine at least one ulterior data piece based on the initial data piece, including iteratively, starting from the initial data piece, modifying one or more parameter values each of a respective dimensional parameter and/or deleting one or more leaf geometrical shapes.

13. The device of claim 9, wherein the processor is configured to insert by being configured to:

obtain pairs of respective data pieces each including a third data piece and a fourth data piece, and for each pair:

test an identity between the 3D shape of the third data piece and the 3D shape of the fourth data piece, and identify one data piece among the third and fourth data pieces as a second data piece upon the testing yielding a positive result.

14. The device of claim 13, wherein the processor is further configured to test by being configured to:

compute a first volume value, the first volume value representing a volume of the discrete geometrical representation of the third data piece, compute a second volume value, the second volume value representing a volume of the discrete geometrical representation of the fourth data piece, and compare the first volume value to the second volume value.

\* \* \* \* \*